US011950436B2

(12) United States Patent
Wheeler et al.

(10) Patent No.: US 11,950,436 B2
(45) Date of Patent: Apr. 2, 2024

(54) ALL-BACK-CONTACT PHOTOVOLTAIC DEVICES USING CRACKED FILM LITHOGRAPHY

(71) Applicants: Alliance for Sustainable Energy, LLC, Golden, CO (US); Colorado School of Mines, Golden, CO (US)

(72) Inventors: Lance Michael Wheeler, Golden, CO (US); Kevin Joseph Prince, Golden, CO (US); Colin Andrew Wolden, Denver, CO (US); Mirzojamshed M. Mirzokarimov, Lakewood, CO (US); Christopher Paul Muzzillo, Evergreen, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 18/341,473

(22) Filed: Jun. 26, 2023

(65) Prior Publication Data

US 2023/0422533 A1    Dec. 28, 2023

Related U.S. Application Data

(60) Provisional application No. 63/355,635, filed on Jun. 26, 2022.

(51) Int. Cl.
*H10K 30/57*    (2023.01)
*H10K 30/40*    (2023.01)
(Continued)

(52) U.S. Cl.
CPC ............ *H10K 30/57* (2023.02); *H10K 30/40* (2023.02); *H10K 30/85* (2023.02); *H10K 30/86* (2023.02); *H10K 71/12* (2023.02); *H10K 71/233* (2023.02)

(58) Field of Classification Search
CPC ...... H10K 30/57; H10K 71/233; H10K 71/12; H10K 30/40; H10K 30/86
See application file for complete search history.

(56) References Cited

U.S. PATENT DOCUMENTS 6,794,290 B1    9/2004   Papasouliotis et al.
2023/0073735 A1  3/2023   Muzzillo et al.

OTHER PUBLICATIONS

Xiao et al., "Photoelectric properties of transparent conductive metal mesh films based on crack template and its application in Perovskite solar cells", Proc. SPIE 11064, Tenth International Conference on Thin Film Physics and Applications (TFPA 2019), 110640Z (Jul. 8, 2019). (Year: 2019).*

(Continued)

*Primary Examiner* — Tae-Sik Kang
(74) *Attorney, Agent, or Firm* — Michael A. McIntyre

(57) ABSTRACT

The present disclosure relates to a device that includes an irregular network of interconnected ridges in physical contact with a planar substrate and a perovskite layer, where the planar substrate include a support layer and a first charge selective contact layer, the first charge selective contact layer is positioned between the support layer and the interconnected ridges, each ridge includes a second charge selective contact layer and an insulating layer, the insulating layer is positioned between the first charge selective contact layer and the second charge selective contact layer, and the perovskite layer substantially covers the plurality of interconnected ridges and the underlying planar substrate.

18 Claims, 21 Drawing Sheets

(51) Int. Cl.
    *H10K 30/85*      (2023.01)
    *H10K 30/86*      (2023.01)
    *H10K 71/12*      (2023.01)
    *H10K 71/20*      (2023.01)

(56) References Cited

OTHER PUBLICATIONS

Muzzillo et al., "Fundamentals of Using Cracked Film Lithography to Pattern Transparent Conductive Metal Grids for Photovoltaics", Langmuir 2020, 36, 4630-4636. (Year: 2020).*

Baca, A.J. et al., "Manipulating the assembly of perovskites onto soft nanoimprinted titanium dioxide templates," IOP Publishing, Nanotechnology, vol. 29, 2018, 11 pages.

Bernard, M. et al., "Etching of p- and n-type doped monocrystalline diamond using an ECR oxygen plasma source," Elsevier Diamond and Related Materials, vol. 11, 2002, 5 pages.

Cui, M. et al., "High conductivity and transparency metal network fabricated by acrylic colloidal self-cracking template for flexible thermochromic device," Elsevier Organic Electronics, vol. 83, 2020, 6 pages.

He, B. et al., "Vertical nanostructure arrays by plasma etching for applications in biology, energy, and electronics," Elsevier Nano Today, vol. 8, 2013, 25 pages.

Huang, X. et al., "Active and Deformable Organic Electronic Devices based on Conductive Shape Memory Polyimide," ACS Applied Materials & Interfaces, vol. 12, 2020, 8 pages.

Jumabekov, A.N. et al., "Fabrication of Back-Contact Electrodes Using Modified Natural Lithography," Applied Energy Materials, vol. 1, 2018, 6 pages.

Kim, M. et al., "Cracking-assisted fabrication of nanoscale patterns for micro/nanotechnological applications," RSC Nanoscale, vol. 8, 2016, 19 pages.

Lin, X. et al., "Dipole-field-assisted charge extraction in metal-perovskite-metal back-contact solar cells," Nature Communications, vol. 8, No. 613, Sep. 20, 2017, 8 pages.

Lin, X. et al., "Honeycomb-shaped charge collecting electrodes for dipole-assisted back-contact perovskite solar cells," Nano Energy, vol. 67, 2020, 8 pages.

Muzzillo, C.P. et al., "Macroscopic Nonuniformities in Metal Grids Formed by Cracked Film Lithography Result in 19.3% Efficient Solar Cells," ACS Applied Materials & Interfaces, vol. 12, 2020, 8 pages.

Muzzillo, C.P. et al., "Fundamentals of Using Cracked Film Lithography to Pattern Transparent Conductive Metal Grids for Photovoltaics," Langmuir, vol. 36, 2020, 7 pages.

Prince, K.J. et al., "Complementary interface formation toward high-efficiency all-back-contact perovskite solar cells," Cell Reports Physical Science, vol. 2, Mar. 24, 2021, 17 pages.

Tainter, G.D. et al., "Long-Range Charge Extraction in Back-Contact Perovskite Architectures via Suppressed Recombination," Joule, vol. 3, May 15, 2019, 13 pages.

Wheeler, L. et al., "Switchable photovoltaic windows enabled by reversible photothermal complex dissociation from methylammonium lead iodide," Nature Communications, vol. 8, 1722, Nov. 23, 2017, 9 pages.

Wong-Stringer, M. et al., "A flexible back-contact perovskite solar micro-module," Energy & Environmental Science, vol. 12, 2019, 10 pages.

Xiao, Z. et al., "Photoelectric Properties of Transparent Conductive Metal Mesh Films Based on Crack Template and Its Application in Perovskite Solar Cells," Proceedings of SPIE, Tenth International Conference on Thin Film Physics and Applications, vol. 11064, 2019, 6 pages.

Yoshikawa, K. et al., "Silicon heterojunction solar cell with interdigitated back contacts for a photoconversion efficiency over 26%," Nature Energy, vol. 2, 2017, 8 pages.

* cited by examiner a b c a b c

ALL-BACK-CONTACT PHOTOVOLTAIC DEVICES USING CRACKED FILM LITHOGRAPHY

CROSS-REFERENCE TO RELATED APPLICATIONS

This application claims priority from U.S. Provisional Patent Application No. 63/355,635 filed on Jun. 26, 2022, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

To date all-back contact (ABC) perovskite solar cell (PSC) are processed mostly based on photolithography. However, photolithography requires expensive equipment and processing methods, which are not ideal for scalable large-area manufacturing and can be a barrier to entry into industrial scale production and into the marketplace. Thus, there remains a need for alternative manufacturing methods capable of producing full-scale ABC PSCs reliably and affordably.

SUMMARY

An aspect of the present disclosure is a device that includes an irregular network of interconnected ridges in physical contact with a planar substrate and a perovskite layer, where the planar substrate include a support layer and a first charge selective contact layer, the first charge selective contact layer is positioned between the support layer and the interconnected ridges, each ridge includes a second charge selective contact layer and an insulating layer, the insulating layer is positioned between the first charge selective contact layer and the second charge selective contact layer, and the perovskite layer substantially covers the plurality of interconnected ridges and the underlying planar substrate.

In some embodiments of the present disclosure, the network may be characterized by the ridges having an average width, W, between 0.05 µm and 500 µm. In some embodiments of the present disclosure, the network may be characterized by the ridges having an average height, H, between 0.01 µm and 10 µm. In some embodiments of the present disclosure, the network may be characterized by the ridges having an average spacing, S, between 0.1 µm and 1,000 µm. In some embodiments of the present disclosure, the network may be characterized by the ridges having a length, L, between 1 µm and 500 µm.

In some embodiments of the present disclosure, the first charge selective contact layer may be electron selective. In some embodiments of the present disclosure, the first charge selective contact layer may include a transparent conductive oxide. In some embodiments of the present disclosure, the second charge selective contact layer may be hole selective. In some embodiments of the present disclosure, the second charge selective contact layer may include a metal layer and a metal oxide layer, and the metal oxide layer may be positioned between the metal layer and the insulating layer.

In some embodiments of the present disclosure, the perovskite may include at least one of a three-dimensional (3D) structure, a two-dimensional (2D) structure, a one-dimensional (1D) structure, and/or a zero-dimensional (0D) structure. In some embodiments of the present disclosure, the perovskite may have a structure according to $ABX_3$, A includes a first cation, B includes a second cation, and X includes an anion. In some embodiments of the present disclosure, A may include at least one of cesium, methylammonium (MA), and/or formamidinium (FA). In some embodiments of the present disclosure, B may include at least one lead and/or tin. In some embodiments of the present disclosure, X may include a halide. In some embodiments of the present disclosure, the perovskite may include $Cs_{1-z}(MA_{1-x}FA_x)_zPb(I_{1-a}Br_a)_3$. In some embodiments of the present disclosure, $0.85 \leq z \leq 0.99$, $0.05 \leq x \leq 0.25$, and $0.05 \leq z \leq 0.25$.

In some embodiments of the present disclosure, the perovskite layer may have a thickness between 500 nm and 1000 nm. In some embodiments of the present disclosure, the insulating layer may include a metal oxide.

An aspect of the present disclosure is a method that includes a first depositing of a liquid layer onto a first selective contact layer, a first treating of the liquid layer thereby transforming the liquid layer into a solid layer, a second depositing of an insulating material onto the solid layer, a third depositing of a second selective contact material onto the insulating material and removing the solid layer. The solid layer includes a network of cracks having an average depth between 0.01 µm and 10 µm, the second depositing results in at least a first portion of the depth being filled with the insulating material, the third depositing results in at least a second portion of the depth being filled with the second selective contact material, the removing results in the removal of substantially all of the insulating material and substantially all of the second selective contact material except for the insulating material and second selective contact material positioned in the depth of the cracks, and the removing results in the forming of a network of ridges positioned on the first selective contact layer. Further, the ridges each include a layer of the insulating material and a layer of the second selective contact material, the layer of the insulating material is positioned between the first selective contact layer and the layer of the second selective contact material, and each ridge has a height, H, between 0.01 µm and 10 µm.

In some embodiments of the present disclosure, the method may further include, after the first treating, a second treating, where before the second treating the cracks have a first average width, and after the second treating the cracks have a second average width that is greater than the first average width.

BRIEF DESCRIPTION OF DRAWINGS

Some embodiments are illustrated in referenced figures of the drawings. It is intended that the embodiments and figures disclosed herein are to be considered illustrative rather than limiting.

Transmission spectra are blanked to the glass substrate.

Figure 5A:
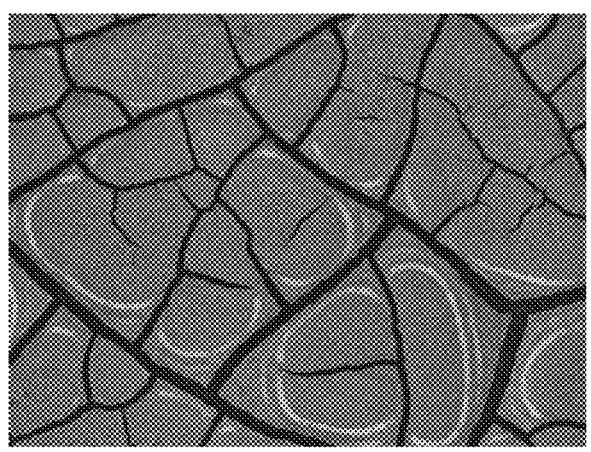
FIG. 5A illustrates images of as-prepared cracked film lithography substrate before treating with $O_2$ plasma to widen the cracks, according to some embodiments of the present disclosure. (a) Optical, (b) 3D profilometry (scale bars 10 μm), (c) scanning electron microscopy (SEM) cross-section (scale bar 4 μm) images.
Figure 5A:
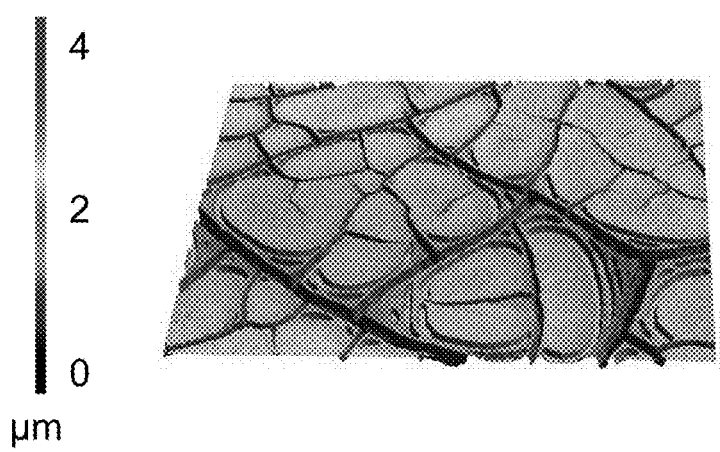
Figure 5A:
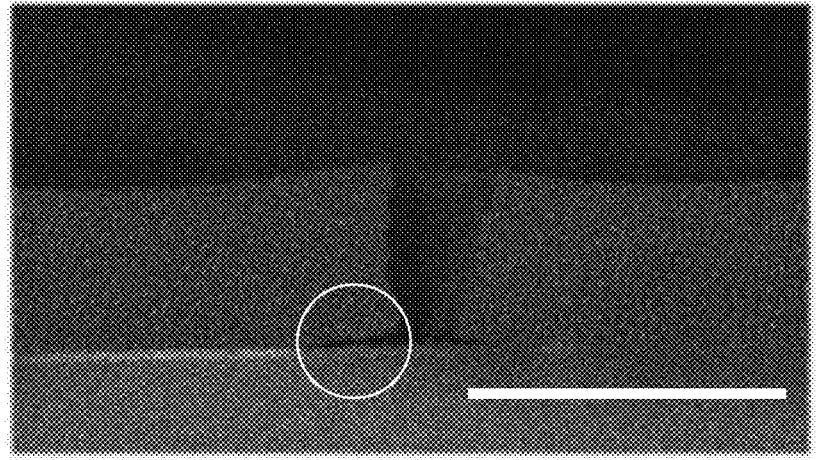
Figure 5B:
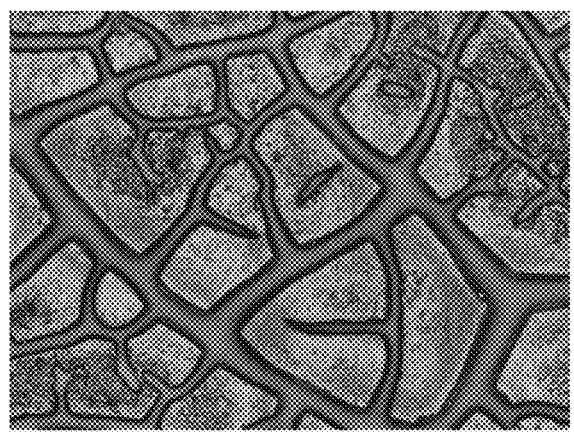
FIG. 5B illustrates images of the substrates illustrated in FIG. 4A after treating with $O_2$ plasma for about 2 hours for crack widening to adjust the relative area of the electron and hole selective contacts, according to some embodiments of the present disclosure. (a) Optical (b) 3D profilometry (scale bars 10 μm), (c) SEM cross-section (scale bar 4 μm).
Figure 5B:
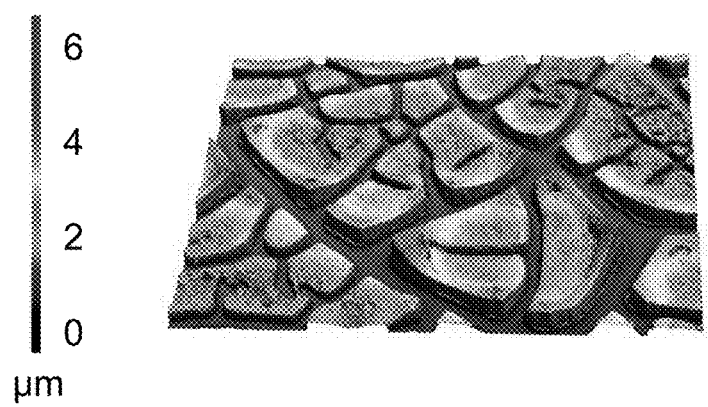
Figure 5B:
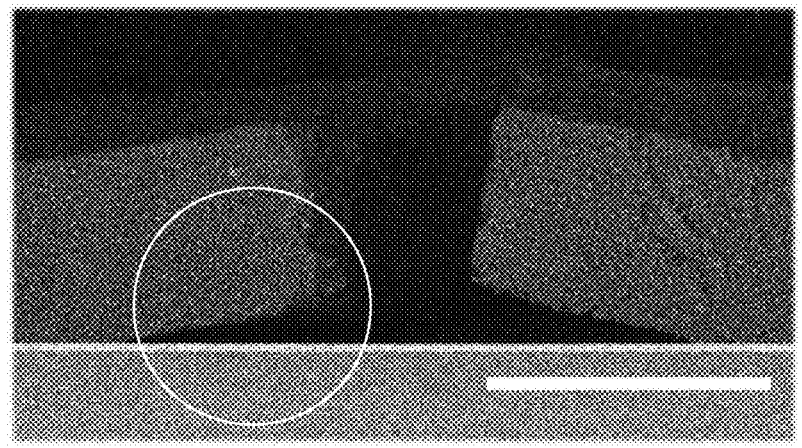
Figure 5C:
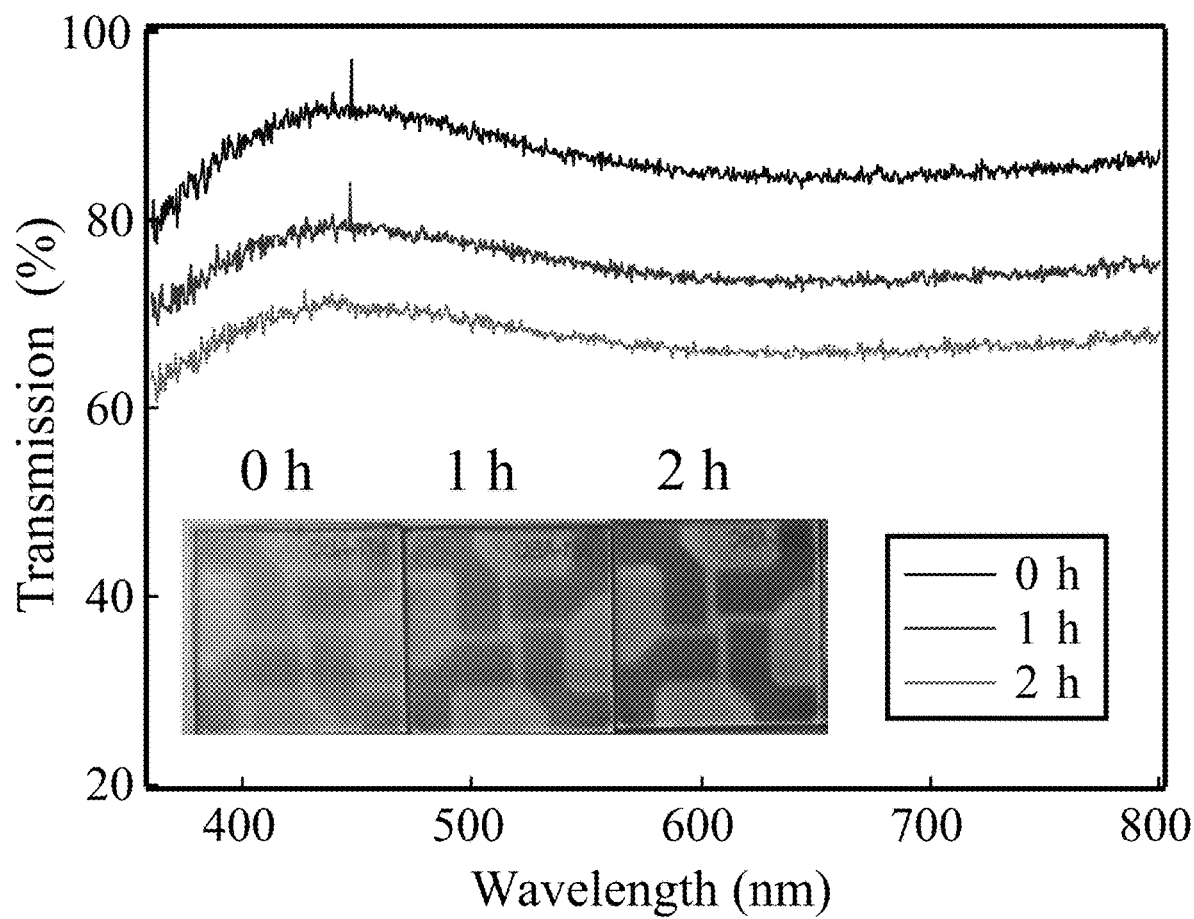
FIG. 5C illustrates transmission spectra of patterned electrodes after liftoff using cracked film lithography templates with varying $O_2$ plasma widening times. Inset includes 1"×1" images of devices before perovskite deposition, according to some embodiments of the present disclosure.
Figure 5D:
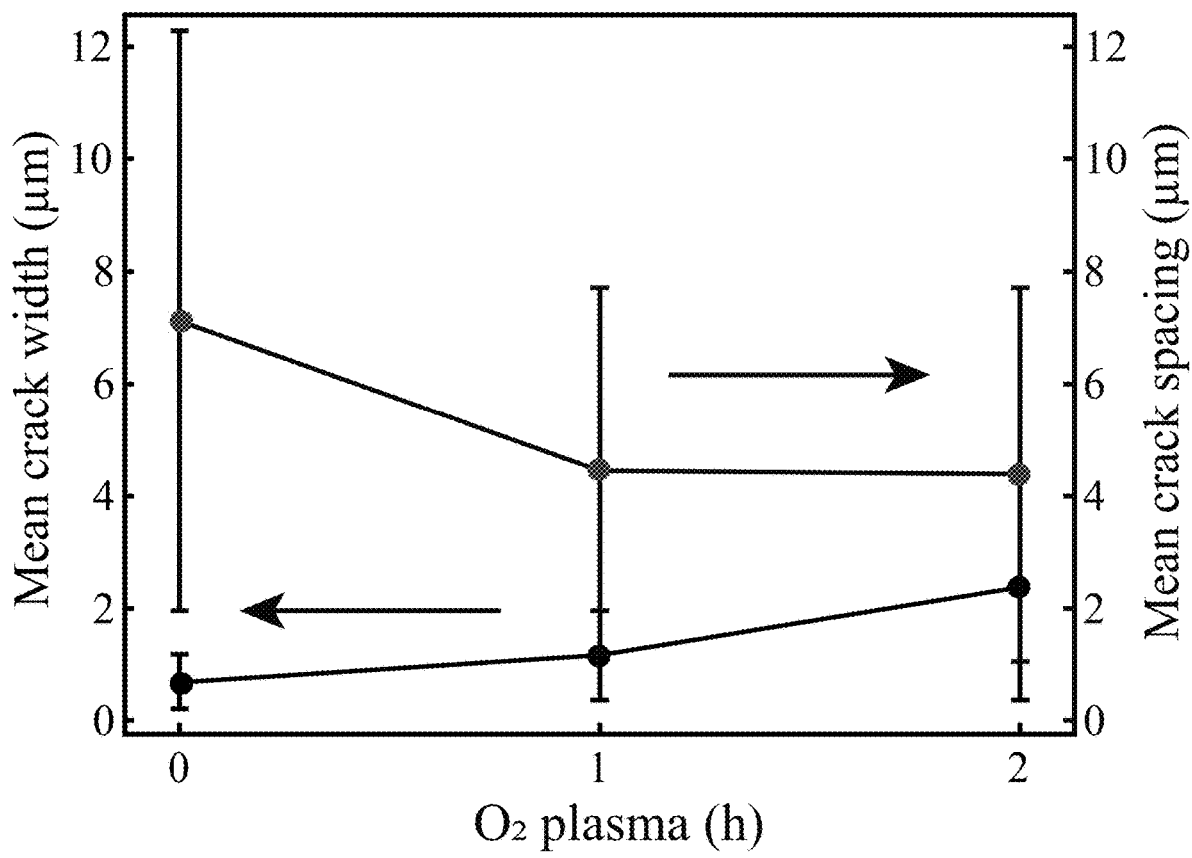

FIG. 5D illustrates Ni/$NiO_x$ crack area and sheet resistance of bare ABC electrode crack network as a function of time exposed to $O_2$ plasma, according to some embodiments of the present disclosure.

Figure 5E:
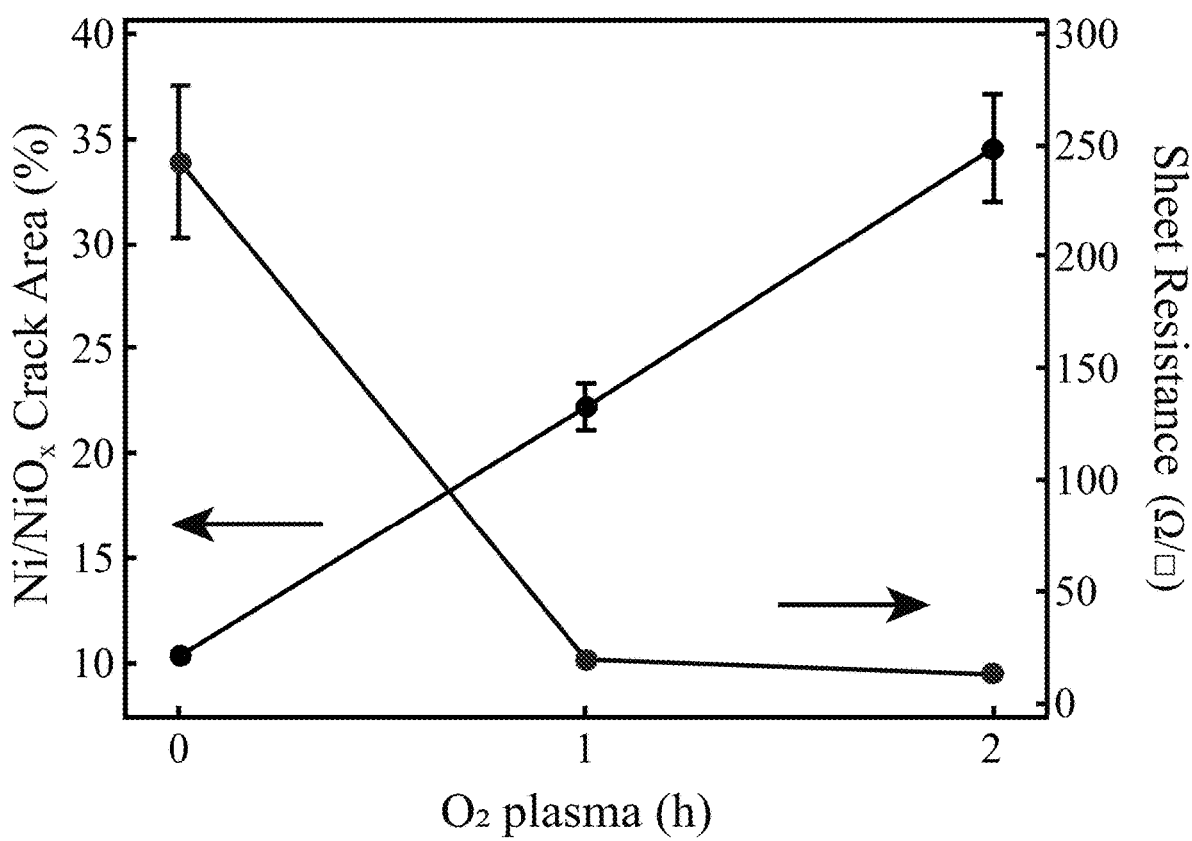

FIG. 5E illustrates mean crack width and crack spacing as a function of time exposed to $O_2$ plasma, according to some embodiments of the present disclosure. Error bars are standard deviations, see method sections for details.

Figure 6:
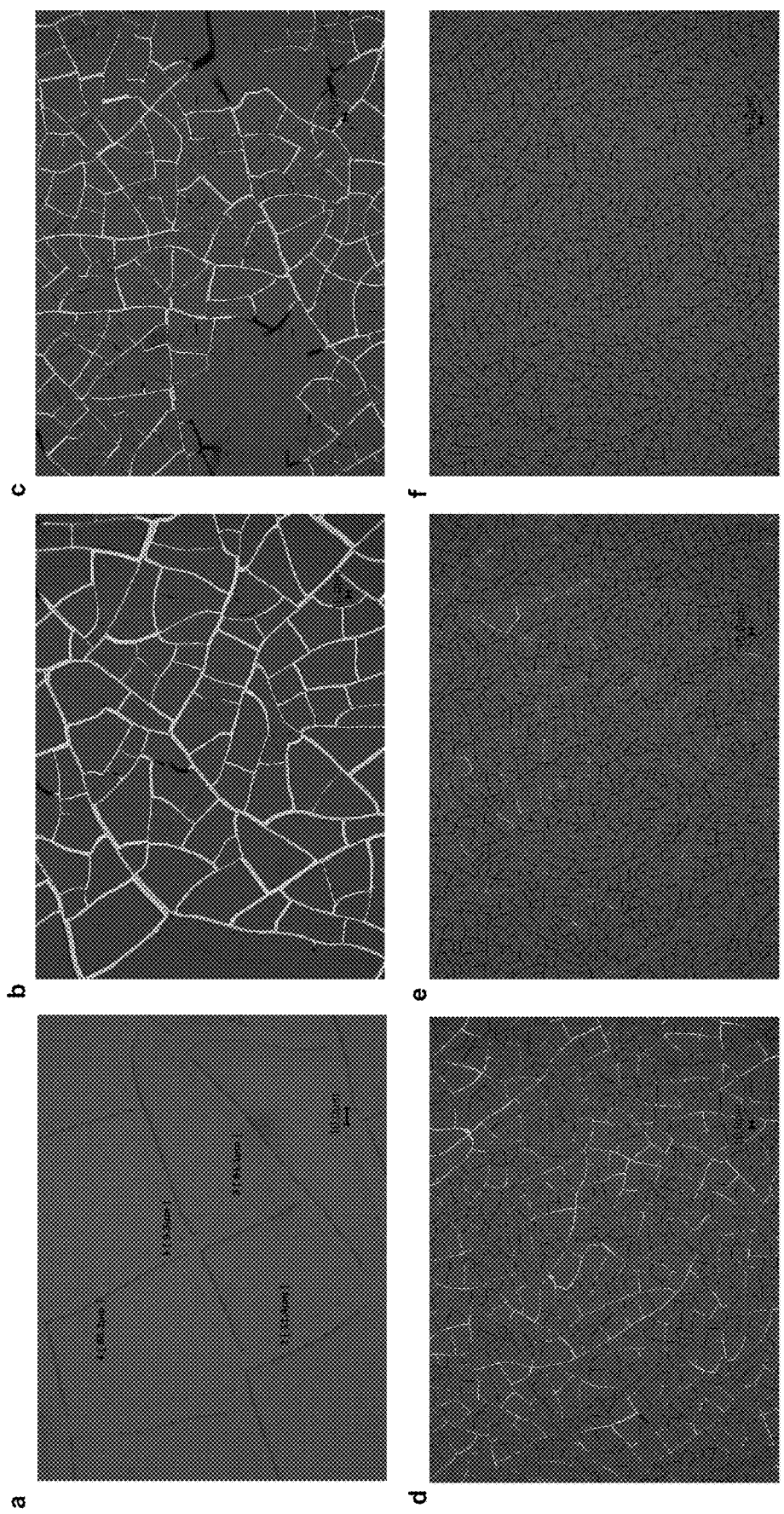

FIG. 6 illustrates optical images of bare $SiO_2$/$Al_2O_3$/Ni/$NiO_x$ back-contact electrode networks formed from crack film lithography templates spun at (a) 2000 rpm, (b) 3000 rpm, (c) 4000 rpm, (d) 6000 rpm, (e) 8000 rpm, and (f) 10000 rpm, according to some embodiments of the present disclosure.

Figure 7:
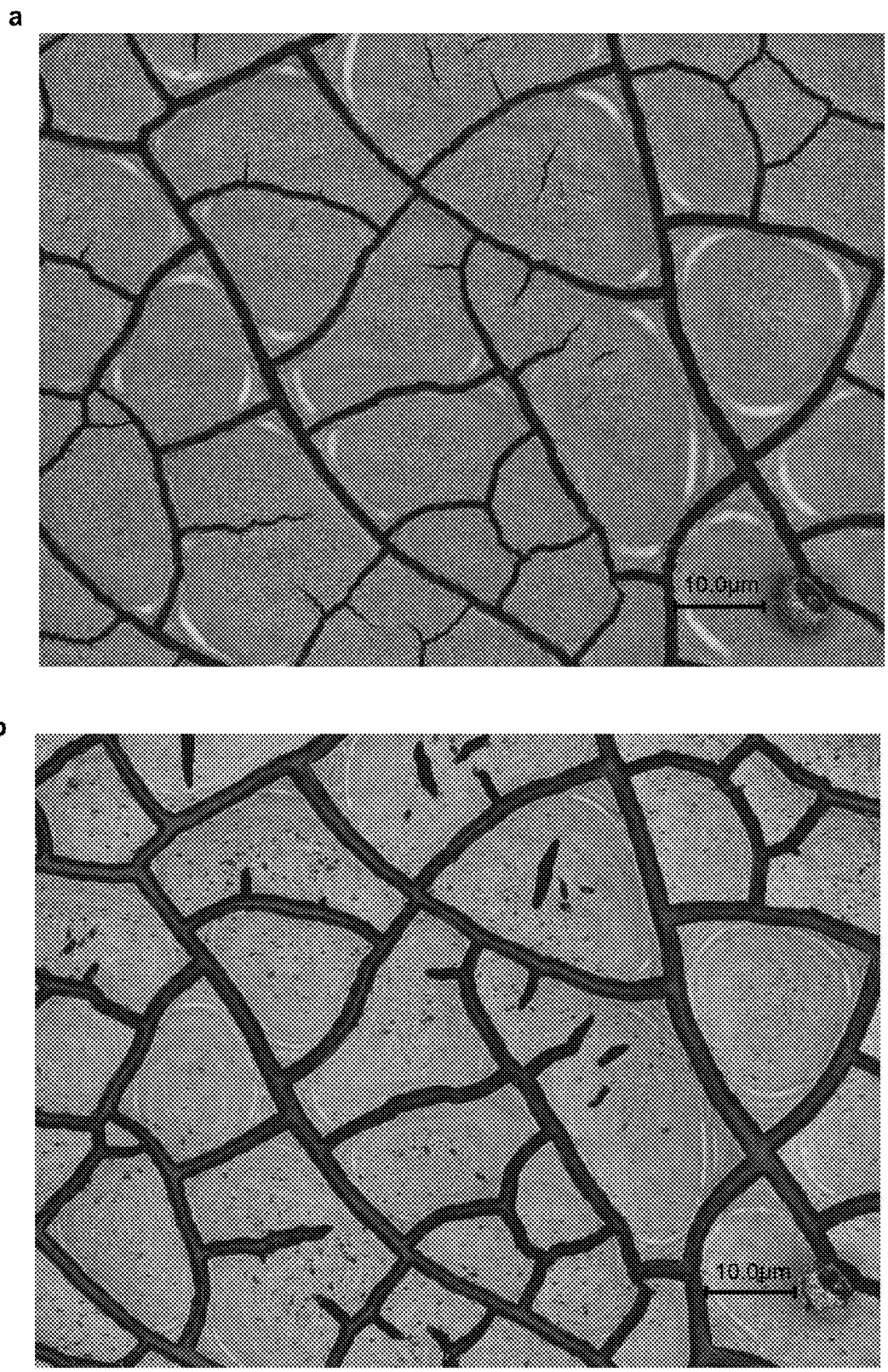

FIG. 7 illustrates optical images of the same PMMA crack network location as spun at 8000 rpm (a) before and (b) after crack widening using UV-ozone for about 1 hour, according to some embodiments of the present disclosure.

Figure 8A:
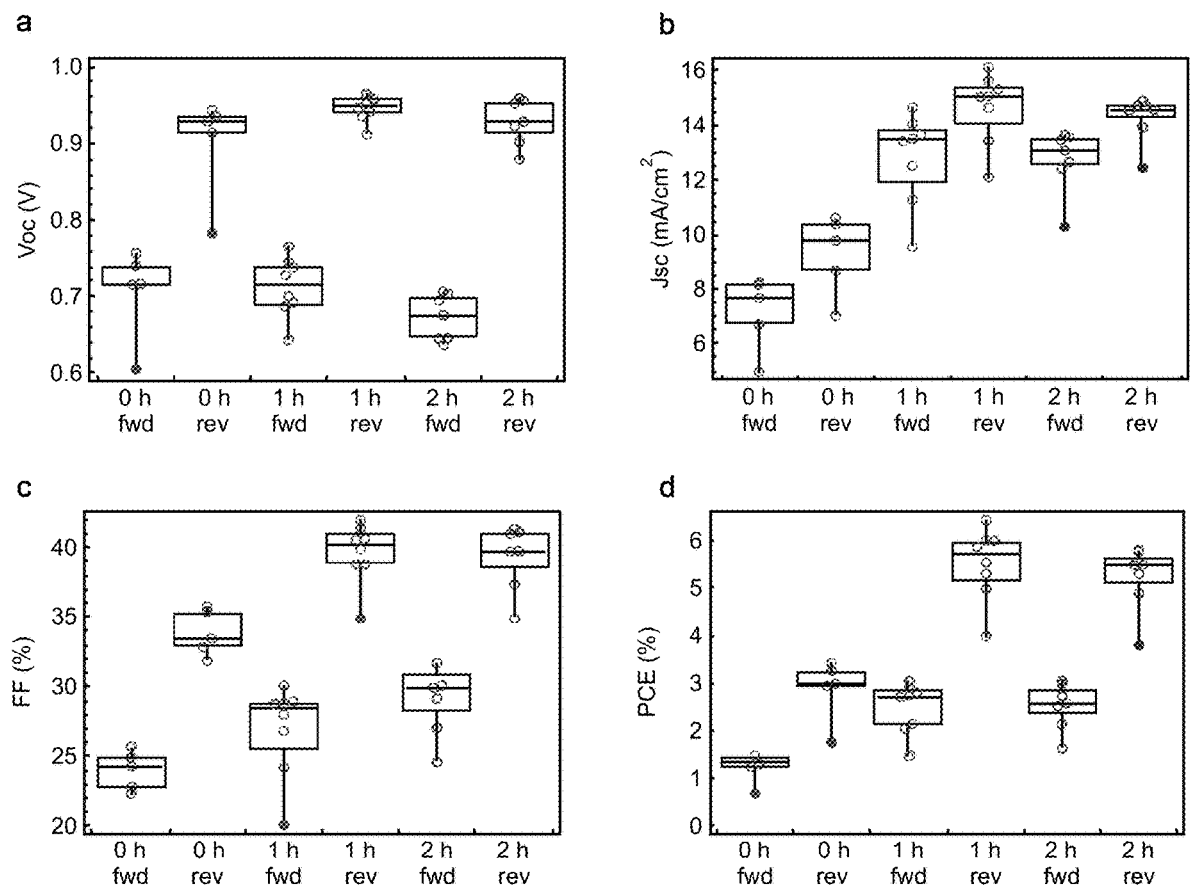

FIG. 8A illustrates the impact of crack widening and crack geometry as a result of time exposed to $O_2$ plasma, on all-back-contact perovskite solar cell performance metrics, according to some embodiments of the present disclosure. Boxplots of performance metrics for various $O_2$ plasma widening times derived from forward (fwd) and reverse (rev) current-voltage scans. (a) Open-circuit voltage ($V_{oc}$), (b) short-circuit current density ($J_{sc}$), (c) fill factor (FF), and (d) power-conversion efficiency (PCE) are shown.

Figure 8B:
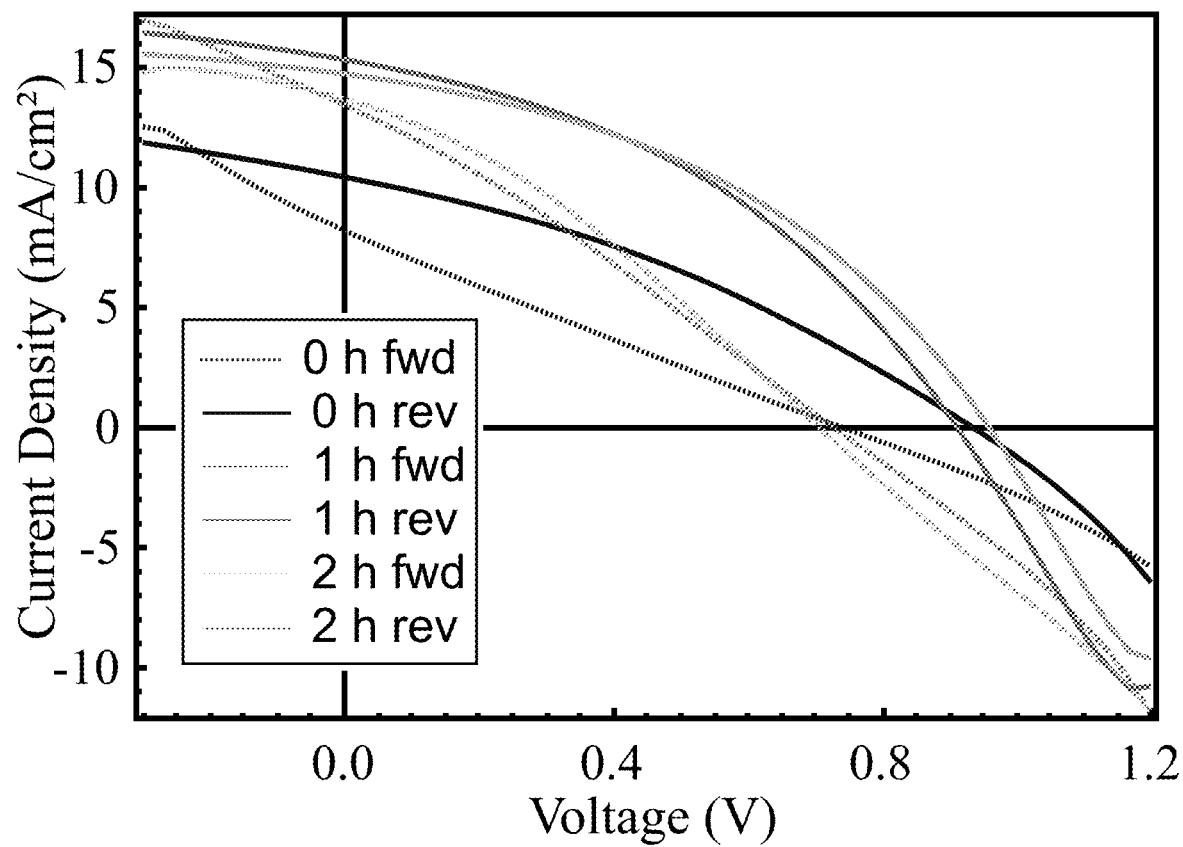

FIG. 8B illustrates representative current density-voltage scans, according to some embodiments of the present disclosure.

Figure 8C:
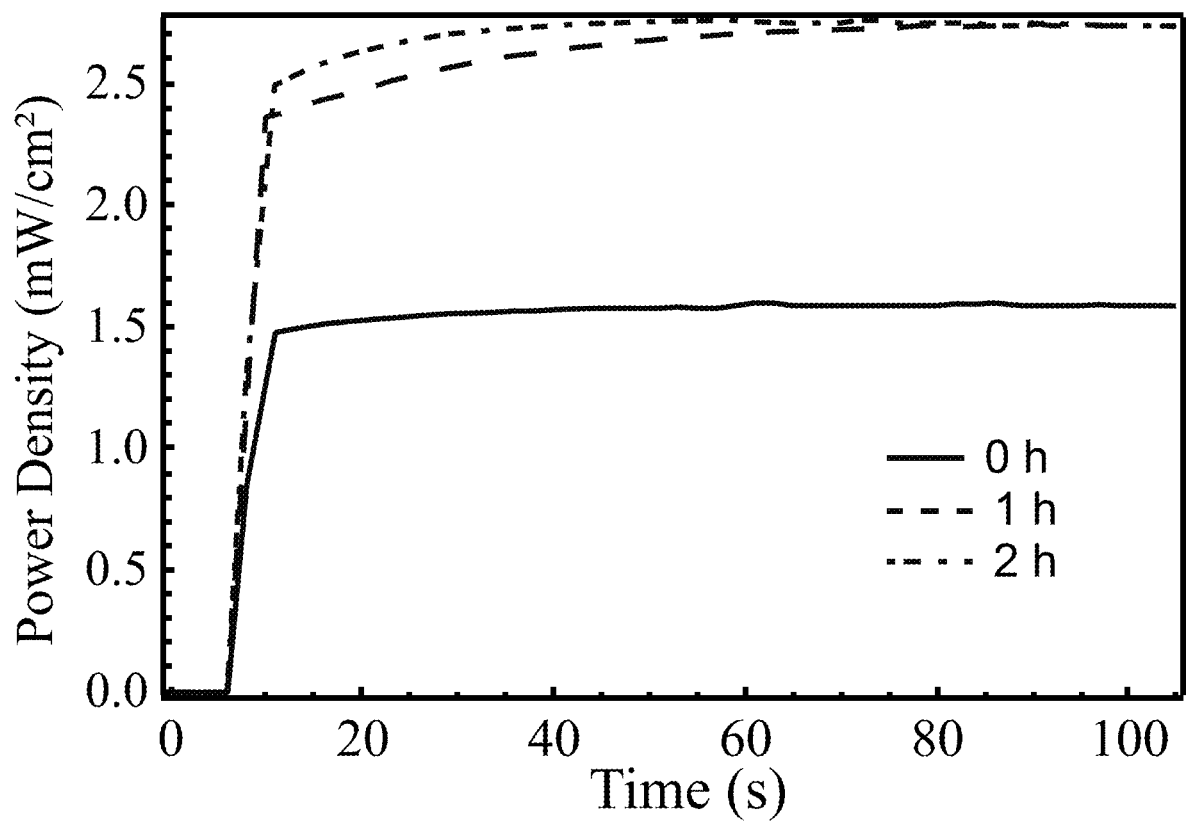

FIG. 8C illustrates representative stabilized power-output measurements from front illumination at V=350 mV, according to some embodiments of the present disclosure.

Figure 9:
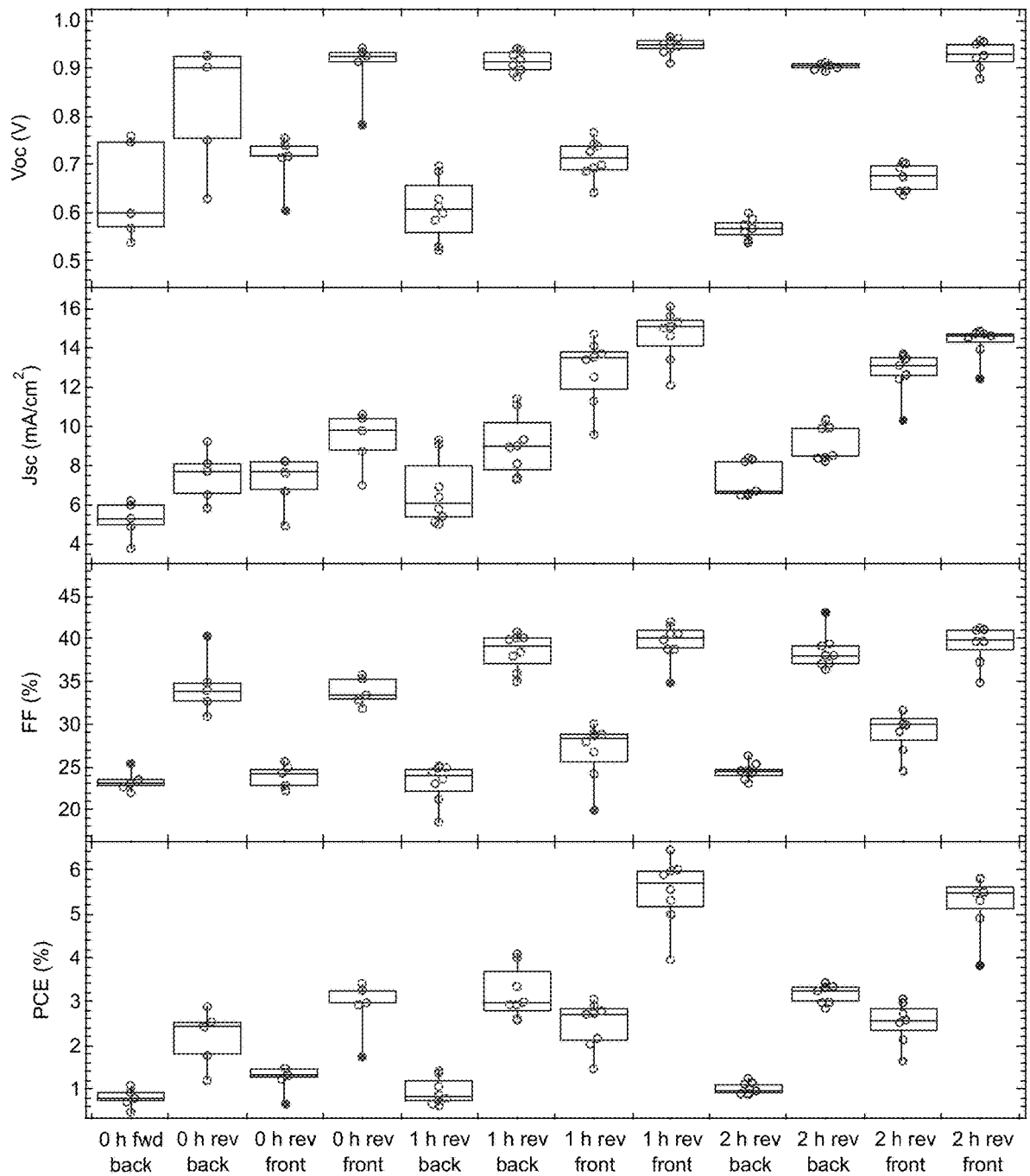

FIG. 9 illustrates a bifacial performance comparison metrics, according to some embodiments of the present disclosure. Current density voltage scan derived power performance metrics of all CFL ABC devices through each $O_2$ plasma exposure time illuminated both from the glass-ITO (back) and perovskite (front) sides.

Figure 10:
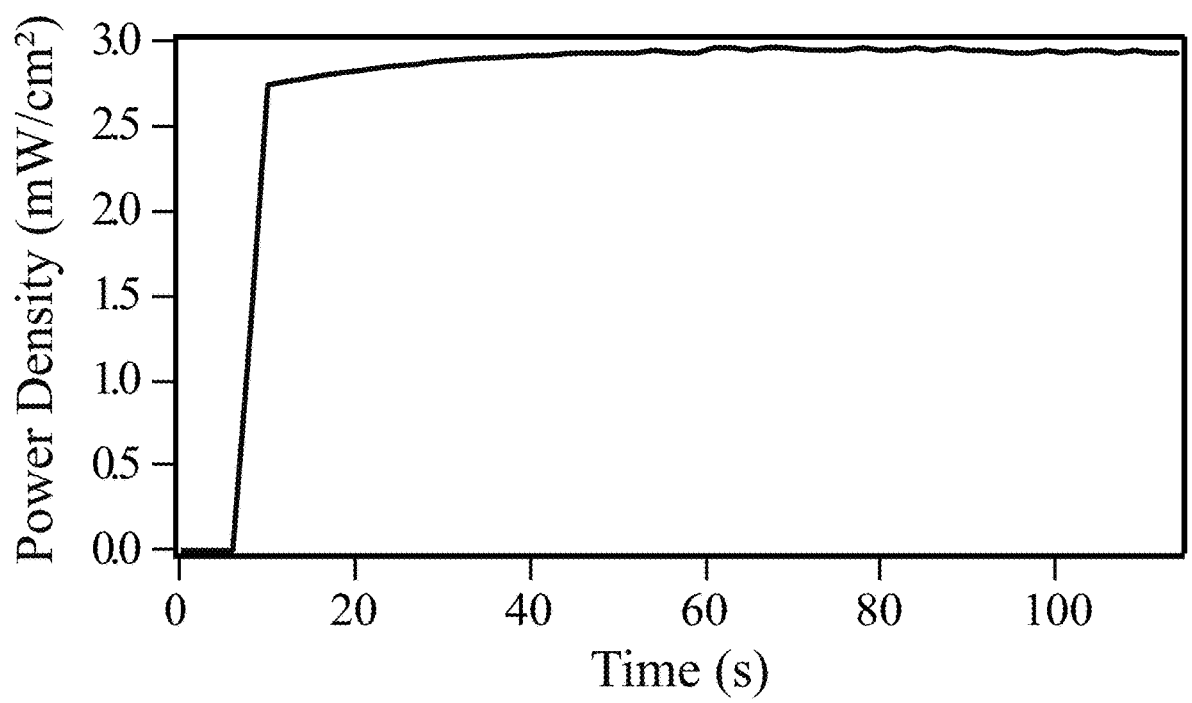

FIG. 10 illustrates the stabilized power output (SPO) obtained from the best-performing device (~1 hour $O_2$ plasma exposure time) at 400 mV=2.94 mW/cm² or % PCE, according to some embodiments of the present disclosure.

Figure 11:
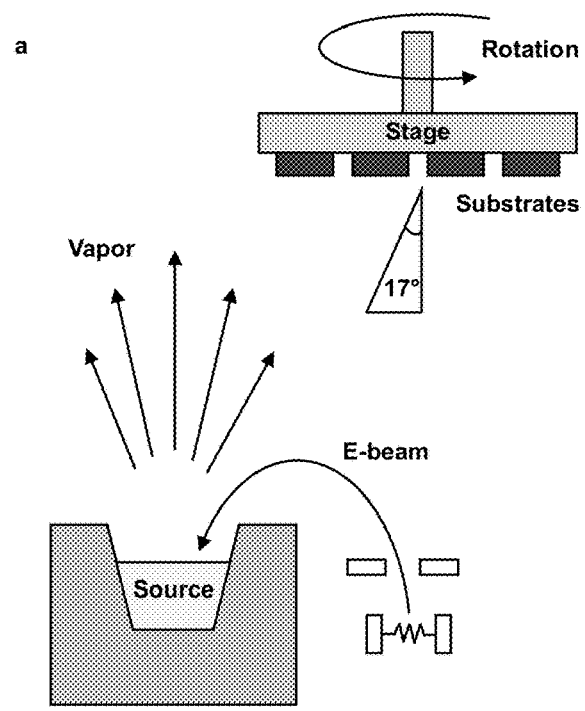
Figure 11:
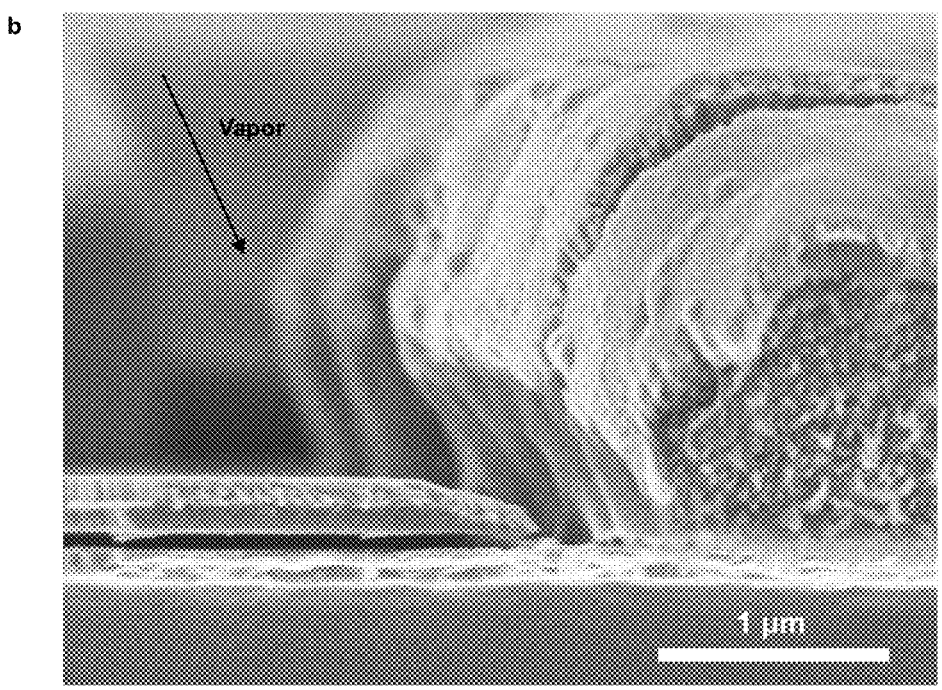

FIG. 11 illustrates (a) schematic of angled electron beam evaporation and rotating sample state, (b) cross-section WEM image with arrow inset highlighting the angle of vapor deposition, according to some embodiments of the present disclosure.

Figure 12A:
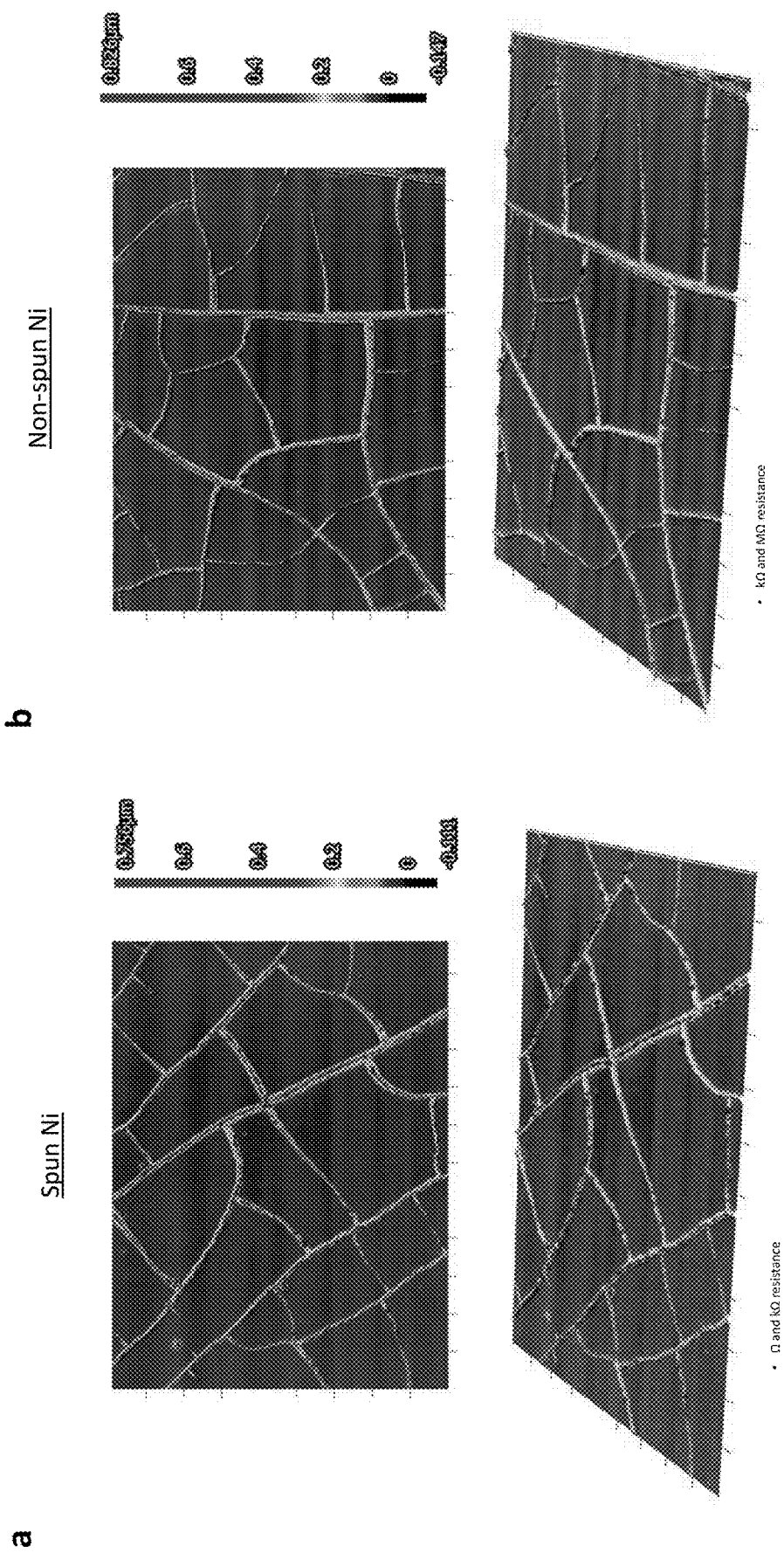

FIG. 12A illustrates (a) optical and laser profilometry images of cracked film network made from spun Ni electron beam evaporation using rotating state, (b) optical and laser profilometry images of cracked film network made from non-spun Ni electron beam evaporation, according to some embodiments of the present disclosure.

Figure 12B:
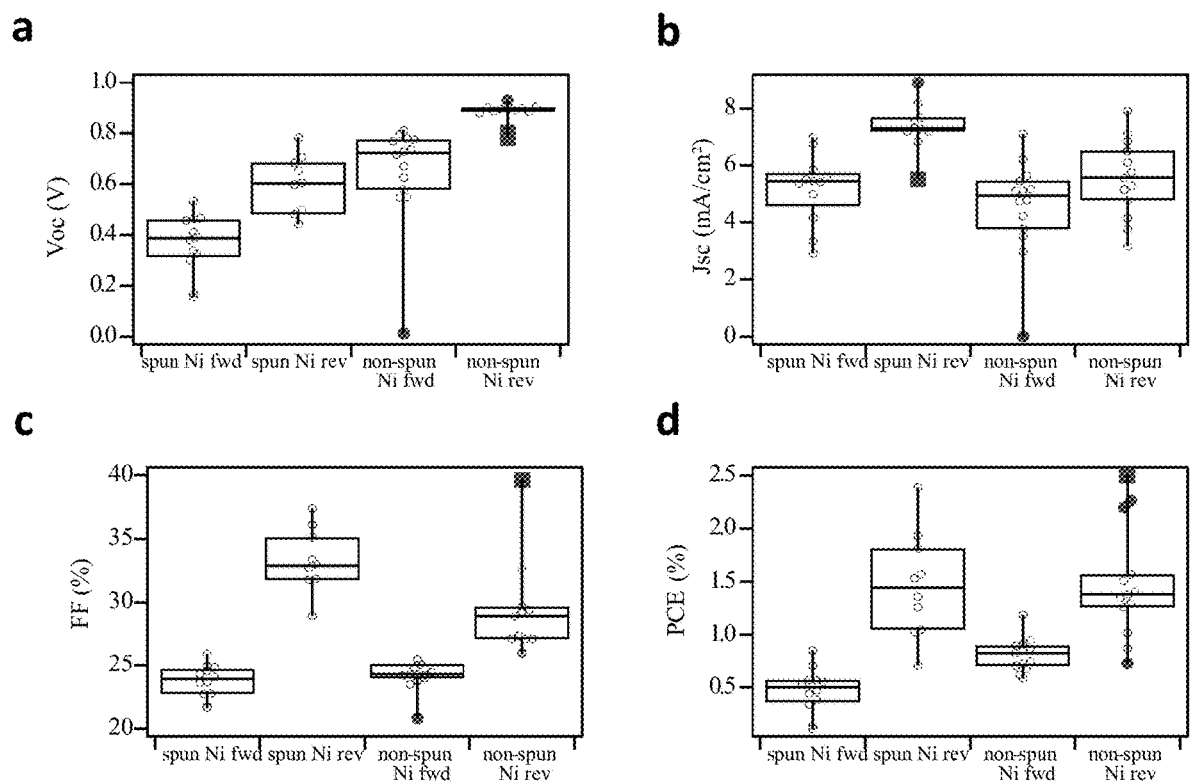

FIG. 12B illustrates $V_{OC}$, $J_{SC}$, FF, and PCE performance metric statistics of spun vs. non-spun Ni cracked film lithograph perovskite solar cells. All devices had spun dielectric stack of $SiO_2$ and $Al_2O_3$, according to some embodiments of the present disclosure.

REFERENCE NUMERALS

100 . . . device
110 . . . substrate
115 . . . support layer
120 . . . first selective contact layer
130 . . . insulating layer
140 . . . second selective contact layer
150 . . . absorber layer
160 . . . ridge
170 . . . space
S . . . ridge spacing
W . . . ridge width
L . . . ridge length
H . . . ridge height
200 . . . method
210 . . . depositing of $1^{st}$ selective contact layer
220 . . . depositing of liquid layer of template forming material
230 . . . drying of liquid layer to form cracked solid layer
240 . . . crack widening
250 . . . depositing of insulating layer
260 . . . depositing of $2^{nd}$ selective contact layer
270 . . . removing of template
280 . . . cleaning of surfaces
290 . . . annealing
295 . . . depositing of perovskite layer

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Among other things, the present disclosure relates to all-back-contact (ABC) solar cells characterized by both electrodes being positioned on the same side of the absorber (i.e., photovoltaic material), which can among other things, mitigate losses associated with parasitic absorption and reflection at the front surface of conventional solar cell designs. As described herein, unique ABC perovskite solar cells have been fabricated using cracked film lithography (CFL), a technique that is scalable to large areas, enabling the manufacture of larger solar cells and modules, without the need for expensive photolithography. Metal halide perovskite ABC devices also offer higher theoretical conversion efficiency than conventional designs, but the benefits go beyond increased efficiency. Other benefits include, (1) enhanced durability by using compact, all-inorganic transport layers, (2) flexible absorber processing, as transport layer process conditions are not limited by the constraints of the absorber material, (3) improved manufacturability due to reduced scaling losses and flexible defect passivation, (4) reduced material costs by eliminating transparent conductors and organic transport layers, and (5) unique in-situ characterization opportunities for probing the absorber layer under device operation to advance fundamental understanding. In addition, adding a front contact to these cells will provide a foundation for ultrahigh-efficiency three-terminal tandem devices.

As described herein, CFL is used to form ABC electrodes for perovskite solar cells. Further, the CFL method described herein decouples crack width adjustments from crack spacing. Among other things, widening the cracks making up a network of cracks can adjust the ratio of the electron- and hole-selective contact areas, which can alter the back-contact electrode transparency, sheet resistance, perovskite charge transport, and/or final device performance.

Figure 1A:
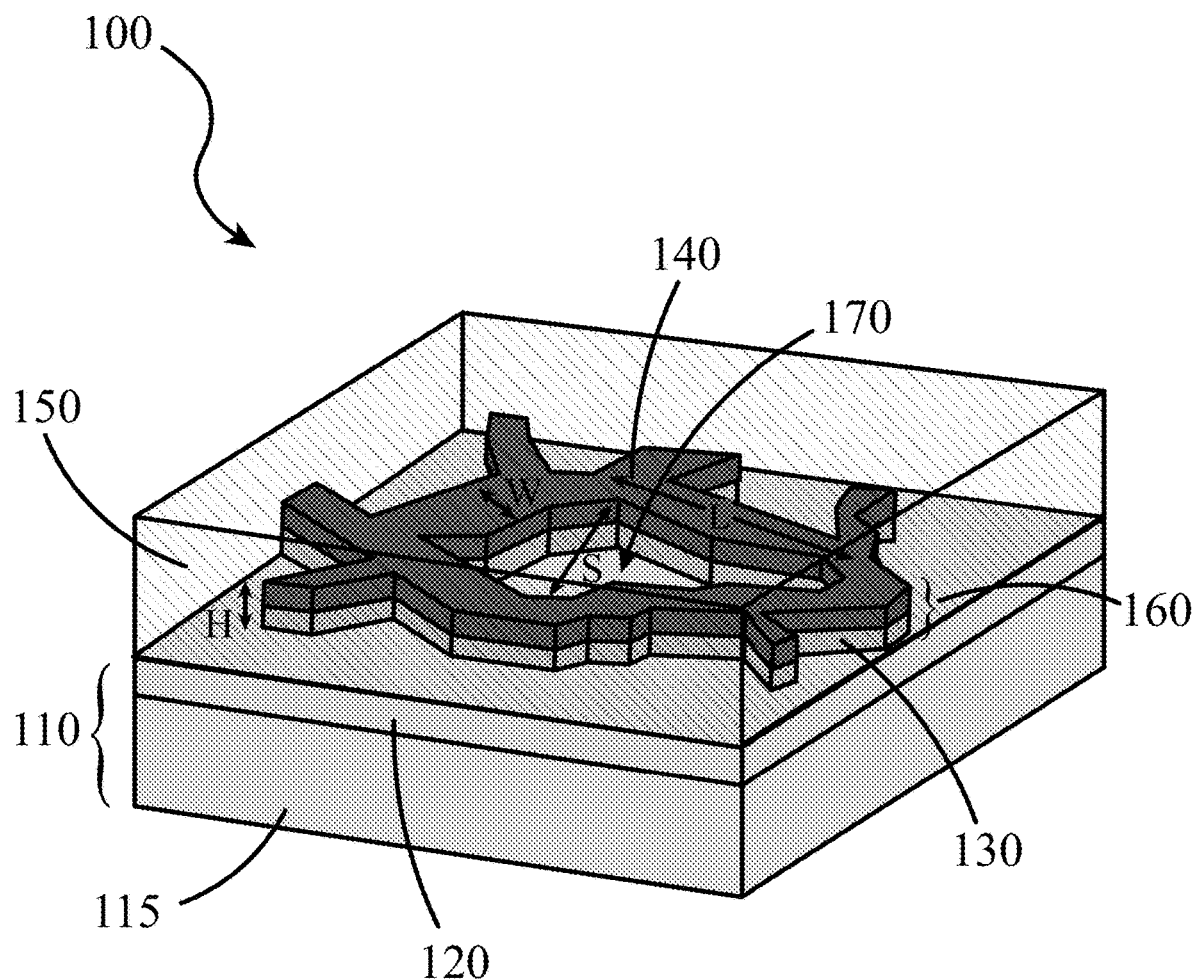
FIG. 1A illustrates a device, according to some embodiments of the present disclosure.

FIG. 1A illustrates a device 100, e.g., a solar cell, resulting from a manufacturing method utilizing CFL, according to some embodiments of the present disclosure. This exemplary device 100 includes a plurality of ridges 160 (only one ridge is called out in using reference numeral 160), i.e., raised surfaces in relief positioned on an underlying planar substrate 110, with spaces 170 filled with an absorber layer 150 positioned on the substrate between the ridges 160 and covering the ridges 160 themselves. As shown in FIG. 1A, a substrate 110 may be a composite layer that includes a first selective contact layer 120 positioned on a support layer 115 (e.g., glass). For example, a first contact layer 120 may include an $SnO_2$ electron transfer layer (ETL) positioned on a transparent contact layer constructed of indium doped tin oxide (ITO), which is positioned on a support layer 115 constructed of glass. The ridges 160 positioned on the surface of the substrate 110 may be constructed of two layers positioned on top of one another, a second selective contact layer 140 and an insulating layer 130, where the insulating layer 130 is positioned between the planar substrate 110 and the second selective contact layer 140. This arrangement, therefore, ensures that the first selective contact layer 120 is electrically isolated from the second selective contact layer 140. This configuration provides the architecture for an ABC solar cell.

As described in more detail below, the ridges 160 (e.g., composite layers constructed of the second selective contact layer 140 and the insulating layer 130) result from the depositing of the materials selected to form these layers onto a template of cracks; i.e., cracked film lithography (CFL). The template of cracks is formed in several steps by, among other things, the deposition of a crack forming material (e.g., poly(methyl methacrylate) (PMMA)) onto and in direct contact with the first selective contact layer 120 (see FIG. 2 and related text). The template (i.e., the crack forming material having cracks) may be described as a flat, planar layer of solidified material (e.g., PMMA) covering the underlying substrate 110, with a plurality of cracks separating and dividing the template into different sections or islands (see FIGS. 6 and 7). The cracks fully penetrate the complete thickness of the solid template of the crack forming material (see Panels c of FIGS. 5A and 5B) exposing the underlying outer surface of the first selective contact layer 120. Deposition of the insulating layer 130 and the second selective contact layer 140 onto the template of cracks fills the cracks with these materials and covers the outer surface of the solid template of cracks. Subsequent removal of the template, now covered with the materials used to synthesize the insulating layer 130 and the second selective contact layer 140, results in the removal of the insulating and contact layer materials positioned on the "islands" of template material, thereby forming the spaces 170 defined by the ridges 160, while the material positioned in the cracks remains behind, resulting in the formation of the ridges 160 themselves, as illustrated in FIG. 1A (see FIG. 3B). The spaces 170 provide exposed areas of the first selective contact layer 120, which may be subsequently covered and filled with an absorber material, to form an absorber layer 150 (e.g., a perovskite layer) that substantially fills the spaces 170 and covers the ridges 170, including the second selective contact layer 140.

Referring again to FIG. 1A, a network of ridges 160, e.g., constructed of an insulating material and a second selective contact material, may be characterized by several metrics. These include the average height, H, of the ridges 160, the average width, W, of the ridges 160, and the average characteristic length, L, of the ridges 160. In addition, a network of ridges 160 may be characterized by an average spacing, S, or distance between adjacent ridges 160. Of course, each of these metrics is a simple statistical value that is provided as a convenient way to characterize a network of ridges 160 positioned on the substrate 110 of a device 110. Any number of other and/or additional statistical metrics may be used to provide a more representative description of the physical and/or geometric configuration of a network of cracks, for example, ranges, statistical distributions, and/or mathematical equations fitted to predict statistical metrics of interest. Optical microscopy measurement errors for W are within ±100 nm. Profilometry or cross-section scanning electron microscopy measurement errors for H are within ±10 nm.

Figure 1B:
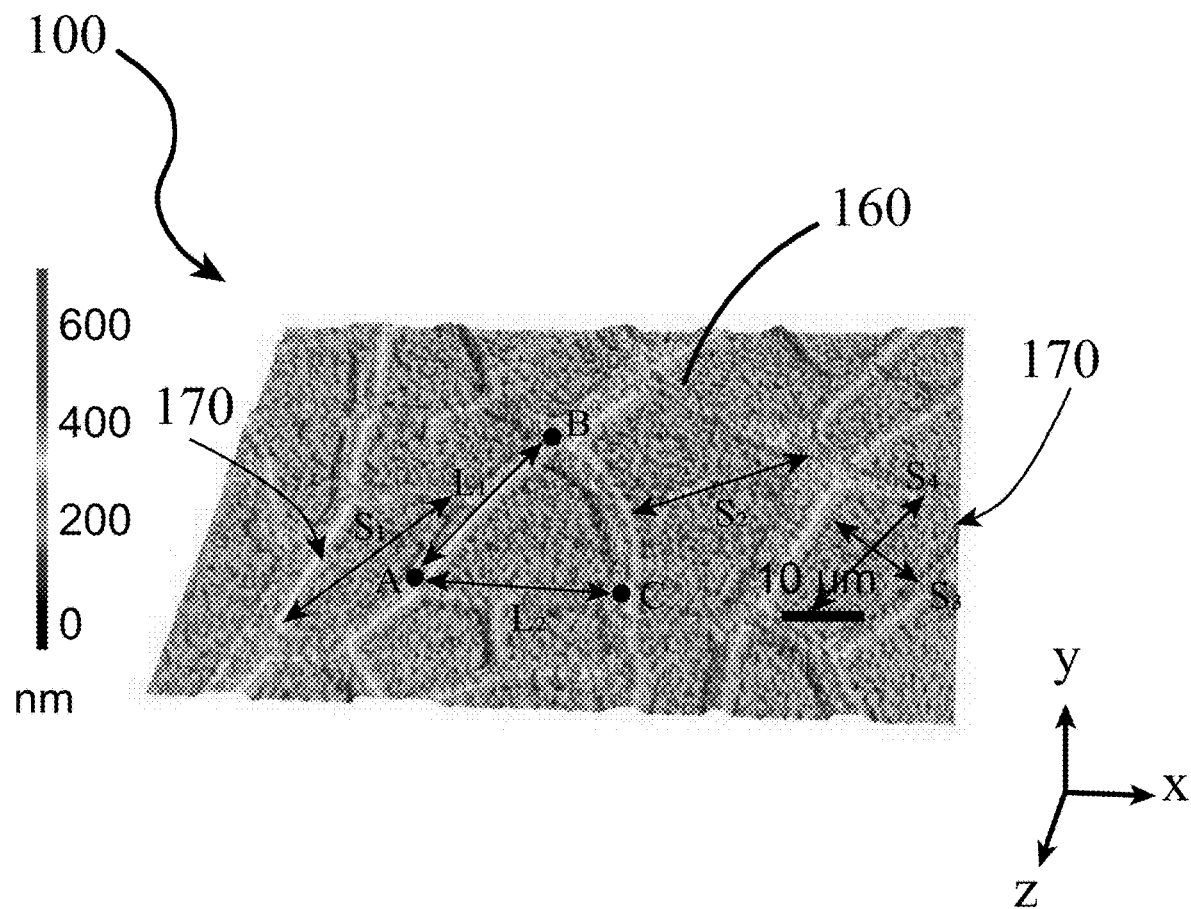
FIG. 1B illustrates 3D profilometry image of a complete ABC PSC device, according to some embodiments of the present disclosure.

The term "characteristic length" is used herein as a pattern of ridges, as shown herein, have irregular shapes, which may include bends and intersections. Referring to FIG. 1B, the length, L, of a single, unique ridge 160 is defined herein as the distance of a ridge positioned between two points, in the xz-plane, where each point is positioned at the intersection and/or termination of two or more distinct ridges. Exemplary points are labeled, A, B, and C in FIG. 1B and two exemplary lengths are illustrated, $L_1$ for the line segment connecting Point A to Point B, and $L_2$ for the line segment connecting Point A to Point C. Referring again to FIG. 1B, the spacing, S, is defined herein as the distance between two adjacent, neighboring ridges in the xz-plane. Four examples of spacing, $S_1$-$S_4$, are shown in FIG. 1B. In other words, the spacing, S, may be viewed as the average distance across a space 170. For irregular shapes, like those illustrated in FIGS. 1A and 1B, a space 170 may have several widths, e.g., a minimum spacing $S_3$ and a maximum spacing $S_4$.

In some embodiments of the present disclosure, the length (in the xz-plane), L, of a ridge 160 may have an average value between 0.5 μm and 20,000 μm, or between 1 μm and 500 μm, or between 1 μm and 100 μm. In some embodiments of the present disclosure, the spacing (in the xz-plane), S, between adjacent ridges 160 may have an average value between 0.1 μm and 5,000 μm, or between 0.1 μm and 1,000 μm, or between 0.1 μm and 100 μm, or between 0.5 μm and 20 μm. In some embodiments of the present disclosure, the height (in the y-axis direction), H, of a ridge 160 may have an average value between 0.01 μm and 10 μm or between 0.05 μm and 1 μm. In some embodiments of the present disclosure, the width of a ridge 160, defined as the perpendicular distance spanning a ridge from one side to the other (in the xz-plane), W, may have an average value between 0.05 μm and 500 μm, or between 0.1 μm and 100 μm, or between 0.1 μm and 20 μm.

Referring again to FIG. 1A, a substrate 110 may be a composite layer constructed of first selective contact layer 120 positioned on a support layer 115. Also as mentioned above, a first selective contact layer 120 may itself be a composite layer, for example a composite layer constructed of a first conductive layer, which may be transparent or opaque, with a charge transport layer (e.g., ETL or HTL) deposited thereon. In some embodiments of the present disclosure, a support layer 115 may be constructed of a substantially transparent material such as a glass, a ceramic, and/or a plastic. In some embodiments of the present disclosure, a support layer 115 may be constructed of a substantially opaque material such as a plastic, a metal, and/or a semiconductor. Examples of suitable plastic supports include polyimide (PI), polycarbonate (PC), polyethylene naphthalate (PEN), poly(methyl methacrylate) (PMMA), and/or poly(ethylene terephthalate) (PET).

In some embodiments of the present disclosure, a first selective contact layer 120 may be constructed using a transparent conducting oxide (TCO), a carbonaceous material, and/or a metal that has been modified to be electron selective. Examples of metals suitable for a contact layer include titanium (Ti), nickel (Ni), aluminum (Al), copper (Cu), gold (Au), and/or silver (Ag). Examples of TCOs include doped tin oxides and/or doped zinc oxides, such as indium-doped tin oxide (ITO), fluorine-doped tin oxide (FTO), indium-doped zinc oxide (IZO), aluminum-doped zinc oxide (AZO), and/or magnesium-doped zinc oxide (MZO). A TCO and/or metal may be modified to be more electron selective by depositing an ETL constructed of a polymer such as poly(3,4-ethylenedioxythiophene):poly (styrene sulfonate) (PEDOT:PSS), a self-assembled monolayer (SAM), a carbonaceous layer such as $C_{60}$ and/or phenyl-C61-butyric acid methyl ester (PCBM), and/or a metal oxide such as at least one of zinc oxide (ZnO), titanium dioxide ($TiO_2$), tungsten oxide ($WO_3$) and/or tin oxide ($SnO_2$) onto the TCO and/or metal. In some embodiments of the present disclosure, the thickness of a TCO layer, a carbon layer, or metal layer may be between 0.01 μm and 10 μm, or between 0.01 μm and 1 μm. In some embodiments of the present disclosure, the thickness of an electron selective modifier layer (i.e., ETL) may be between 0.001 μm and 1 μm, or between 0.01 μm and 1 μm, or between 0.1 μm and 1 μm.

As described herein, an electron selective contact describes a layer or layers that are conductive and selective only or preferentially for electrons. The interface formed by the electron selective contact being positioned adjacent to and in contact with the absorber should have minimal charge carrier recombination velocity, as well as an energy band alignment such that the absorber's holes are blocked, while the absorber's electrons pass through the interface and are laterally conducted out of the solar cell with minimal energy loss. Likewise, the hole selective contact's interface with the absorber should result in minimal recombination, as well as provide a band alignment such that the absorber's electrons are blocked, while the absorber's holes pass through and are collected with minimal energy loss. For the electron selective contact, this typically includes a high conductivity layer such as a TCO and/or metal in combination with an electron selective modifying layer or electron transport layer (ETL), but it can also simply be a single layer if it is both conductive and electron selective. Similarly, a hole selective contact may include a highly conductive layer in combination with a hole selection modifying layer and/or hole transport layer (HTL).

In some embodiments of the present disclosure, an insulating layer 130 may be constructed using a material having a high resistance to current flow, such as oxides with examples including $ZrO_2$, $SiO_2$ and/or $Al_2O_3$, or polymers with examples including polyethylene, polyvinyl chloride, and/or polyamide. In some embodiments of the present disclosure, the thickness of an insulating layer may be between 0.005 μm and 1 μm, or between 0.05 μm and 1 μm, or between 0.5 μm and 1 μm. In some embodiments of the present disclosure, the resistivity of an insulating layer may have a value between $10^6$ Ωm and $10^{20}$ Ωm, or between $10^{10}$ Ωm and $10^{15}$ Ωm.

Referring again to FIG. 1A, the exemplary device 100 illustrated includes a second selective contact layer 140 positioned on the insulating layer 130. In this example, because the first contact layer 120 is an electron selective contact layer, this second selective contact 140 is hole selective. However, this order is described for exemplary purposes only and in some embodiments of the present disclosure, the order can be reversed. An exemplary combination of a hole selective contact layer may include a composite structure having metallic Ni for high conductivity and nickel oxide ($NiO_x$), a hole transport layer. $NiO_x$ is typically mostly composed of $NiO_x$ but other species may be present in the film including $Ni(OH)_2$, NiOOH, $Ni_2O_3$, and/or nickel vacancies. $NiO_x$ can be formed from a variety of techniques including electron-beam evaporation, radio-frequency sputtering, sol-gel, spray-coating, atomic layer deposition, and oxidizing from metallic Ni. The conductive layer can be any material noted above and having a thickness between 0.01 μm and 1 μm. Alternative hole transport layer materials include copper iodide (CuI), copper thiocyanate (CuSCN), copper oxides ($Cu_2O$ and CuO), molybdenum disulfide ($MoS_2$), 2,2',7,7'-tetrakis(N, Nd4methoxyphenylamino)9,9'spirobifluorene (spiroO-MeTAD), poly (3,4-ethylenedioxythiophene):polystyrene sulfonate (PEDOT:PSS), poly(3-hexylthiophene-2,5-diyl) (P3HT), and poly[bis(4-phenyl)(2,4,6-trimethylphenyl) amine] (PTAA). In some embodiments of the present disclosure, a HITL may have thickness between 0.001 μm and 0.5 μm.

Referring again to FIG. 1A, an absorber layer 150 may be constructed using any suitable photovoltaic semiconducting material. Examples include perovskites, organic photovoltaics, silicon (Si), cadmium telluride (Cd(Se,Te)), chalcopyrites ((Ag,Cu)(In,Ga,Al)(Se,S)$_2$), kesterites ((Ag,Cu)$_2$(Zn, Cd)(Sn,Ge)(Se,S)$_4$), and III-V alloys ((Al,Ga,In,)(N,P,As)).

In general, the term "perovskite" refers to compositions having a network of corner-sharing $BX_6$ octahedra resulting in the general stoichiometry of $ABX_3$. Perovskites, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X is an anion and A and B are cations, typically of different sizes. A perovskite having an α-phase structure may be further characterized by eight $BX_6$ octahedra surrounding a central A-cation, where each octahedra is formed by six X-anions surrounding a central B-cation and each of the octahedra are linked together by "corner-sharing" of anions, X.

A perovskite can assume other crystalline forms while still maintaining the criteria of an $ABX_3$ stoichiometry with neighboring $BX_6$ octahedra maintaining X anion corner-sharing. Thus, in addition to α-$ABX_3$ perovskites (in the cubic phase) having a tilt angle of 180 degrees, a perovskite may also assume a tetragonal crystalline phase (i.e., β-$ABX_3$) and/or an orthorhombic crystalline phase (i.e., γ-$ABX_3$), where the adjacent octahedra are tilted relative to the reference axes a, b, and c.

Further, the elements used to construct a perovskite, as described above, A-cations, B-cations, and X-anions, may result in 3D non-perovskite structures; i.e., structures where neighboring $BX_6$ octahedra are not X-anion corner-sharing and/or do not have a unit structure that simplifies to the $ABX_3$ stoichiometry. For example, a perovskite may be in the cubic phase described above, i.e., α-$ABX_3$, compared to a non-perovskite structure constructed of face-sharing $BX_6$ octahedra resulting in a hexagonal crystalline structure and a non-perovskite structure constructed of edge-sharing $BX_6$ octahedra resulting in an orthorhombic crystalline.

In addition, the elements used to construct a perovskite, A-cations, B-cations, and X-anions, may result in non-3D (i.e., lower dimensional structures) perovskite-like structures such as two-dimensional (2D) structures, one-dimensional (1D) structures, and/or zero-dimensional (0D) structures. Such lower dimensional, perovskite-like structures still include the $BX_6$ octahedra, and depending on the dimensionality, e.g., 2D or 1D, may still maintain a degree of X-anion corner-sharing. However, the X-anion corner-sharing connectivity of neighboring octahedra of such lower dimensional structures, i.e., 2D, 1D, and 0D, is disrupted by intervening A-cations. Such a disruption of the neighboring octahedra, can be achieved by, among other things, varying the size of the intervening A-cations.

Thus, a 3D perovskite may be transformed to a 2D perovskite-like structure, 1D perovskite-like structure, and/or 0D perovskite-like structure, where the degree of X-anion corner sharing decreases and the stoichiometry changes according to the formula $(A')_m(A)_{n-1}B_nX_{3n+1}$, where monovalent (m=2) or divalent (m=1) A' cations can intercalate between the X-anions of 2D perovskite-like sheets. 1D perovskite-like structures may be constructed by $BX_6$ octahedral chained segments spatially isolated from each other by surrounding bulky organic A'-cations, leading to bulk assemblies of paralleled octahedral chains. 0D perovskite-like structures may be constructed of isolated inorganic octahedral clusters and surrounded by small A'-cations, which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

Figure 2:
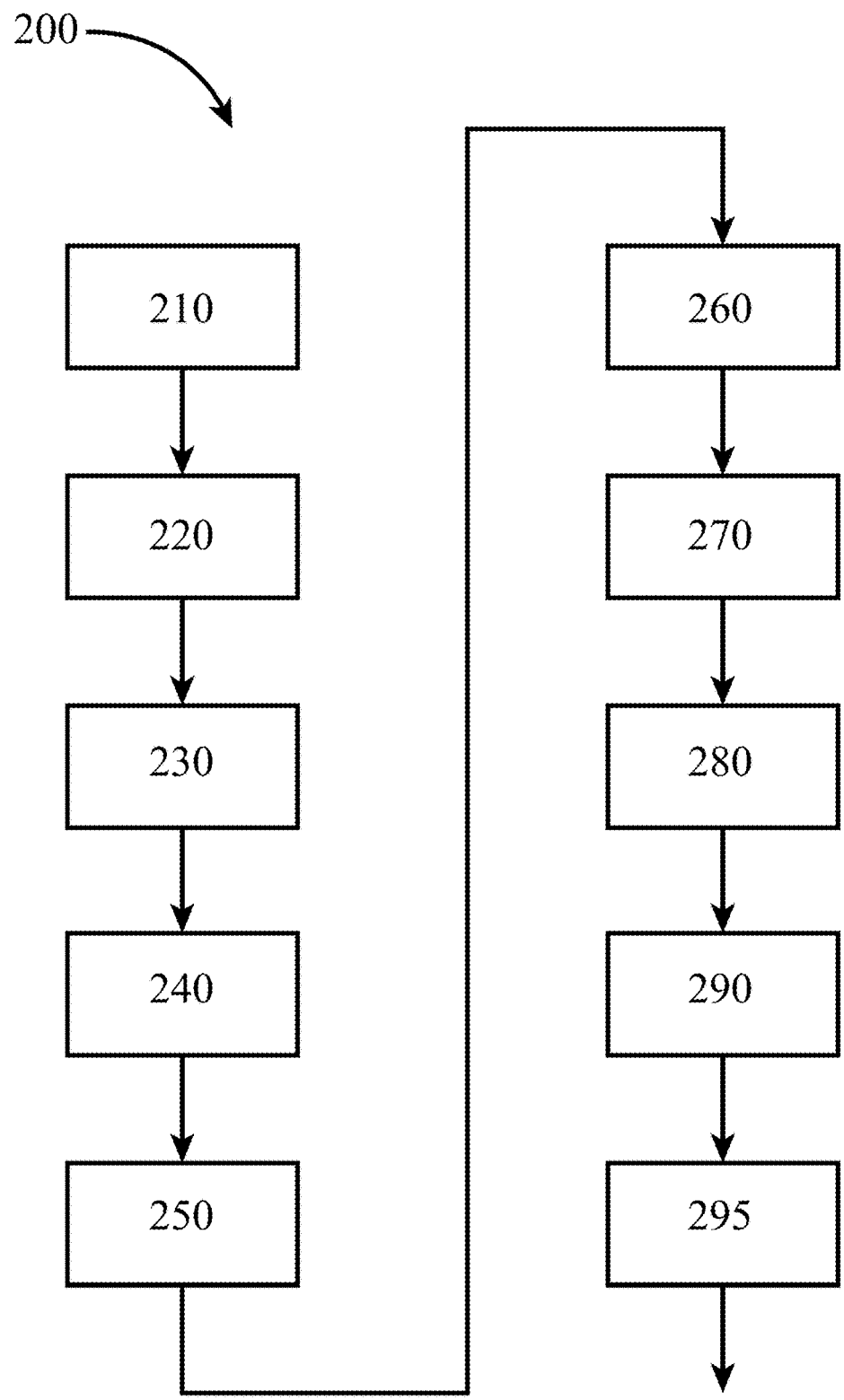
FIG. 2 illustrates a method for manufacturing a device like that illustrated in FIG. 1, according to some embodiments of the present disclosure.

FIG. 2 illustrates a method 200 for making a device 100 like that illustrated in FIGS. 1A and 1B, according to some embodiments of the present disclosure. A method 200 may begin with the depositing 210 of a planar first selective contact layer 120 onto the surface of an underlying support layer 115. For example, a glass support layer 115 may be provided and a first selective contact layer 120 may be deposited onto the glass support layer 115. In some embodiments of the present disclosure, a first selective contact layer 120 may be an electron selective contact layer, where the electron selectivity is achieved by treating a TCO and/or metal with an electron transport material that converts the TCO to an electron selective contact. For example, as shown herein, an ITO layer deposited onto a glass support layer 115 may be modified by the depositing of $SnO_2$ onto the ITO layer, resulting in the formation of an electron selective first contact layer 120, constructed of a composite layer of an SnO$_2$ layer positioned on the ITO layer. In some embodiments of the present disclosure, a glass support layer 115 may be provided with a TCO layer already deposited onto the glass support layer 115. A TCO modifying layer, e.g., of SnO$_2$, may be deposited by solution processing methods such as blade-coating, slot-die coating, curtain-coating, sol-gel, and/or vacuum deposition techniques including e-beam evaporation, radio-frequency sputtering, atomic layer deposition, and/or chemical vapor deposition. Similar methods may be used for the depositing of a hole selective contact layer.

With the planar first selective contact layer 120 successfully deposited, the method 200 may proceed with the steps needed to produce the solid template described above that enables CFL to synthesize the ridges 160 positioned on the first selective contact layer 120, thereby providing the device architecture needed for an ABC solar cell. To accomplish this, the method 200 may proceed with the depositing 220 of a liquid layer of a template forming material. In some embodiments of the present disclosure, this liquid layer may include poly(methyl methacrylate) (PMMA) nanoparticles suspended in a solution of water and isopropyl alcohol. Alternative crack forming materials for creating a template include at least one of TiO$_2$, SiO$_2$, Al$_2$O$_3$, ZnO, SnO$_2$, polystyrene (PS), and/or albumin (e.g., egg whites), which can all be suspended in a variety of solvents. The liquid layer with the crack forming material may be applied to the surface of the first selective contact layer 120 using various solution processing methods such as spin-coating, blade-coating, curtain-coating, drop casting, and/or spray-deposition. With the liquid layer of the templating material applied, the method may proceed with the drying 230 of the liquid layer to form a solid layer of the templating material. In some embodiments of the present disclosure, this drying may begin almost immediately after the depositing of the templating material. The drying 230, as described herein, may result in the almost immediate formation of cracks in the solid templating material, which may then be subsequently used for the lithography steps to produce the ridges 160 illustrated in FIGS. 1A and 1B. In some embodiments of the present disclosure, the drying 230 may be as simple as exposing the liquid layer of the templating material to a dry gas environment for a short period of time. For example, drying 230 may be achieved by exposing the liquid layer to an air environment and/or air stream for a period of time between a few seconds and a minute in duration, or simply letting it dry in ambient air.

Referring again to FIG. 2, after the successful formation of a cracked template, a method 200 may proceed with a crack widening 240 step. In some embodiments of the present disclosure, crack widening 240 may be achieved by exposing the cracked template to at least one of a plasma (e.g., oxygen plasma), ozone, and/or ultraviolet (UV) light. For example, the mean crack width may increase between 0.68±0.48 μm and 2.4±2.0 μm, whereas the mean crack spacing may decrease between 7.1±5.2 μm and 4.4±3.3 μm after about two hours of O$_2$ plasma generated using power between 120 W and 140 W and pressures between 0.6 Torr and 0.7 Torr. UV-ozone widening method can be performed using standard bench top systems such as a Jetlight Company, Inc. Model 30 UV-ozone cleaner.

Once the desired network of cracks (e.g., width, spacing, etc.) has been attained in the solid template, a method 200 may proceed, in order, with the depositing 250 of an insulating layer 130 onto the surface of the cracked template and the portions of the first selective contact layer 120 that have been exposed by the newly formed cracks, but without completely filling the cracks. This may then be followed by the depositing 260 of a second selective contact layer 140 onto the insulating layer 130, whereby at least a portion of the cracks still available (i.e., not filled by the insulating material) is filled by the material making up the second selective contact layer 140. For example, an insulating layer 130 constructed of SiO$_2$ and/or Al$_2$O$_3$ may be deposited onto the cracked template and the first selective contact layer 120 exposed by the cracks via any suitable solution processing and/or gas processing method (e.g., electron-beam evaporation). In some embodiments of the present disclosure, a second selective contact layer 140 of nickel and nickel oxide may be applied to an insulating layer 130, thereby filling at least a portion of the remaining cracks, by electron-beam evaporation and/or magnetron sputter evaporation, respectively. As a result of these steps, the template of a plurality of solid "islands" separated by a plurality of cracks will be covered with the solid materials selected for the insulating layer 130 and the second selective contact layer 140, and the cracks will be filled with these materials, with the underlying first selective contact layer 120 in direct contact with insulating material.

Referring again to FIG. 2, the exemplary method 200 may proceed with the removing 270 (i.e., "liftoff") of the template (e.g., solid PMMA layer with insulating material and second contact layer material positioned thereon) to yield the ridges 160 and spaces 170 illustrated in FIGS. 1A and 1B. In some embodiments of the present disclosure, liftoff may be achieved by immersing the device into a liquid that dissolves the solid template material. For the example of a PMMA layer, this may be achieved by submerging the device in an organic solvent solution that includes at least one of n-methylpyrrolidone, tetrahydrofuran, and/or acetone. In some embodiments of the present disclosure, liftoff may be assisted with the use of ultrasound and/or mechanical agitation.

With the solid template removed, and the ridges 160 and spaces 170 exposed, a method 200 may continue with one or more treatment steps, including, for example a cleaning 280 of the exposed surfaces using at least one of ozone and/or UV. An annealing 290 may also be completed, for example, by heating the device to a temperature of at least 300° C. for up to 60 minutes. Among other things, a cleaning 280 step may provide a more defect-free surface, which enables the formation of a better performing perovskite/contact layer interface. The annealing 290, among other things, may form NiO$_x$ from metallic Ni and reduce reactive oxidation states to less reactive oxidation states.

Referring again to FIG. 2, with the ABS contacts successfully manufactured and treated, the exemplary method 200 illustrated may proceed with the depositing 295 of an absorber layer 150 onto the device. In some embodiments of the present disclosure, an absorber layer 150 constructed of a metal halide perovskite may be deposited. This may be accomplished using any suitable solutions processing and/or gas phase processing methods. As describe herein, in some embodiments of the present disclosure, the method used to make a device may begin with the depositing of an electron selective contact onto a substrate, followed in order, by the creation of a cracked template, followed by the depositing of an insulating layer onto the cracked template, the depositing of a hole selective contact onto the insulating layer, removal of the template, etc. However, in some embodiments the method used may begin with the depositing of a hole selective contact on a substrate, followed in order, by the creation of a cracked template, the depositing of an insulating layer onto the cracked template, the depositing of an electron selective contact onto the insulating layer, removal of the template, etc.

Figure 3A:
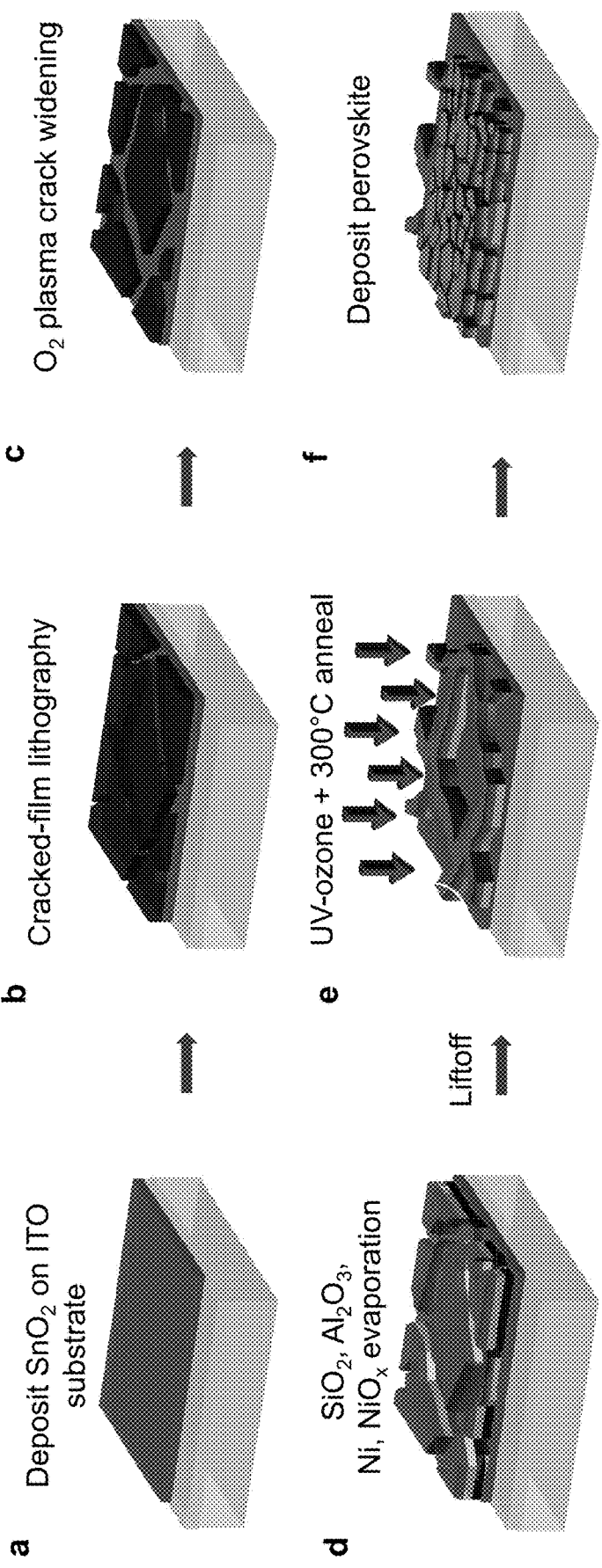
FIG. 3A illustrates an all-back-contact (ABC) perovskite solar cell (PSC) fabricated via cracked film lithography, according to some embodiments of the present disclosure. (a-f) illustrate fabrication steps of an exemplary method: (a) depositing a planar $SnO_2$ electron transport layer onto indium-doped tin oxide (ITO)-coated glass to form an electron selective contact layer, (b) depositing, by spin-coating, polymethyl methacrylate (PMMA) nanoparticle solution and subsequently drying to form a cracked film network, (c) widening of channels (i.e., cracks) using $O_2$ plasma, (d) depositing, by electron-beam evaporate, an insulating layer of made of each of $SiO_2$, $Al_2O_3$, and electron-beam evaporating of Ni and magnetron sputtering $NiO_x$ resulting in the depositing of a hole selective contact layer electrically isolated from the bottom $SnO_2$/ITO contact, (e) removing the PMMA template to expose the ETL layer followed by ozone cleaning and annealing to prepare the exposed surfaces for perovskite deposition, (f) depositing, by solution-processing, the perovskite layer to complete the device.
Figure 3B:
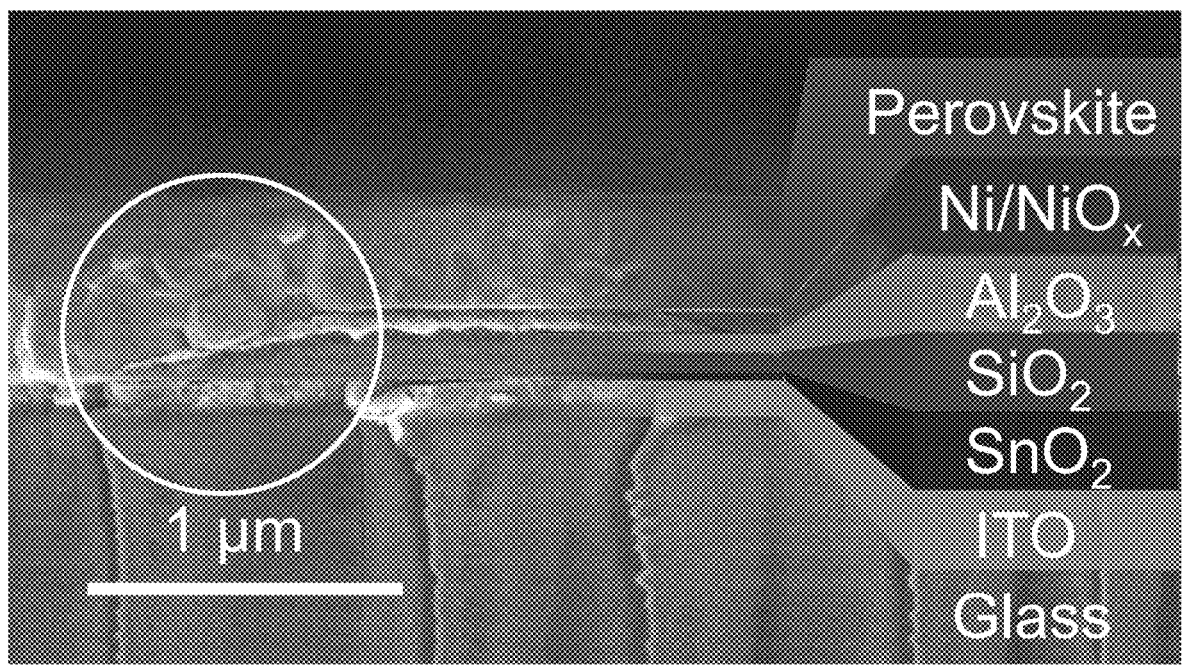
FIG. 3B illustrates a cross-section scanning electron microscopy (SEM) image of a completed ABC PSC device with insets indicating each layer, according to some embodiments of the present disclosure.

FIG. 3A illustrates an exemplary method for producing an ABC PSC that implements CFL, according to some embodiments of the present disclosure. A quasi-interdigitated architecture was utilized, which allowed one selective contact layer 120 to be deposited as a planar layer and a second selective contact layer 140 to be patterned and electrically isolated by an insulating layer 130, as described above. The single patterning step utilized in this design simplified the overall process and required no alignment. Referring to Panel a of FIG. 3A, the exemplary method began with solution processing depositing 120 a planar $SnO_2$ electron transport layer (ETL) onto an ITO coated glass substrate (the combination resulting in an electron selective contact). $SnO_2$ is a good choice as an ETL in PSCs for a number of reasons including a high thermal stability, proper band alignment, enhanced electron extraction, and reduced charge accumulation at the interface with the perovskite absorber layer. Next, a layer of a poly(methyl methacrylate) (PMMA) nanoparticle solution was deposited onto the $SnO_2$ ETL layer (step 200 in FIG. 2). Subsequent drying 230 of the PMMA liquid layer in air resulted in the liquid layer drying to form a solid layer of PMMA with cracks, which provided the cracked film lithography pattern (see Panel b of FIG. 3A). Next, crack widths were increased (step 240 in FIG. 2) by treating the starting cracks with an oxygen plasma (see Panel c of FIG. 3A).

Once the cracks were widened to a desirable width, an insulating bilayer of $SiO_2$ and $Al_2O_3$ was deposited onto the device by electron beam evaporation deposition (step 250 in FIG. 2). This composite insulating layer was deposited to ensure a high shunt resistance between the two selective contact layers, the second of which included Ni and $NiO_x$ deposited onto the insulating layer to form a hole selective contact (see Panel d of FIG. 3A; step 260 in FIG. 2). $NiO_x$ is an ideal hole transport layer (HTL) in PSCs for high thermal stability compared to its organic alternatives. The combination of a $NiO_x$ HTL with a nickel layer results in the forming of a hole selective contact. Once the hole selective contact layer was successfully deposited, the solid PMMA layer CFL mask was removed (step 270 in FIG. 2) by submerging the device in a liftoff solution of mostly n-methylpyrrolidone. In some embodiments of the present disclosure, other solvents like acetone may also be used. Liftoff resulted in the forming of the ABC electrode network with an exposed hole selective contact layer surface of $NiO_x$ and an exposed electron selective contact layer surface of $SnO_2$. Next, these surfaces were cleaned with UV-ozone (step 280 in FIG. 2), followed by an annealing step (step 290 in FIG. 2) to reduce $Ni^{3+}$ states in the hole selective contact layer to prevent unwanted reactions with the perovskite precursors, which would otherwise degrade the device performance (see Panel e of FIG. 3A). Finally, a solution processing method was used to deposit a triple-cation double-halide perovskite layer on top of the ABC electrode network (Step 295 in FIG. 2) consisting of $Cs_{0.05}(MA_{0.83}FA_{0.17})_{0.95}Pb(I_{0.83}Br_{0.17})_3$, where Cs is cesium, MA is methylammonium, FA is formamidinium, Pb is lead, I is iodide, and Br is bromide. The perovskite composition was chosen because, among other things, it is thermally stable and less sensitive to processing conditions (see Panel f of FIG. 3A). However, any varying combination of these elements and molecules that make an $ABX_3$ perovskite film can be used. Rubidium (Rb), potassium (K), tin (Sn), chloride (Cl), and other molecules can also be added.

The method described above, demonstrated that cracked film lithography (CFL) successfully forms an interconnected electrode network (e.g., the combination of a first planar selective contact layer 120 with a series of ridges made up of a second selective contact layer 140 and an insulating layer 130) that is robust and defect-tolerant (see Panel g of FIG. 3A). Unwanted particles and substrate imperfections can lead to electrode breakage during microfabrication. In interdigitated or finger-like electrodes, a break in an electrode isolates a relatively large area leading to current density losses. In contrast, the CFL interconnected grid-type network as described herein has redundant interconnections leading to improved defect tolerance. In addition, the interconnected wire-like network provides low electrode sheet resistance and high transmittance which is beneficial in semi-transparent applications.

Figure 4:
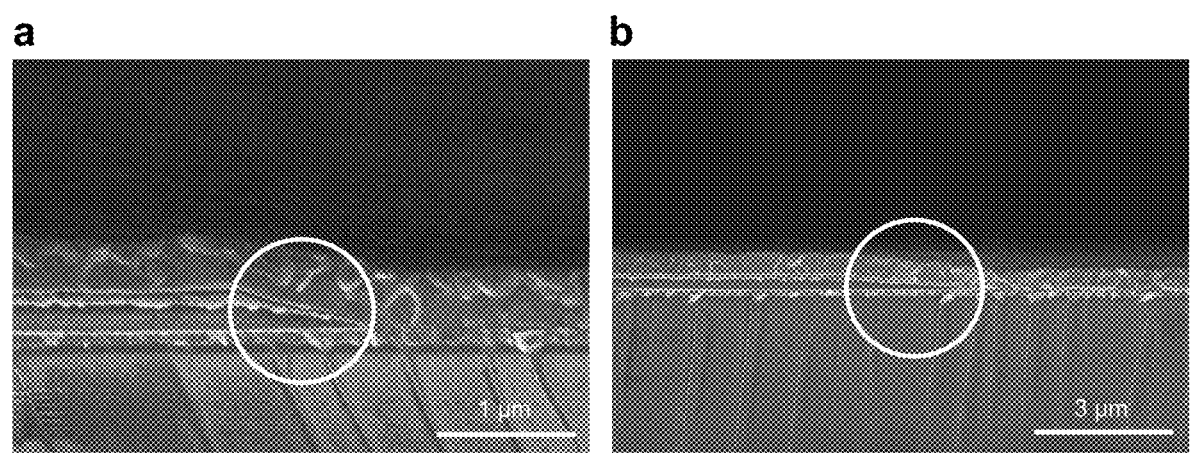
FIG. 4 illustrates cross-section scanning electron microscopy (SEM) images of a completed ABC PSC device showing smooth perovskite morphology deposited over back-contact electrodes, which were formed by cracked film photolithography (CFL), according to some embodiments of the present disclosure.

In ABC devices, photogenerated electron and hole densities are greatest in the perovskite layer at the junction in the perovskite layer between the electron transport layer (ETL) and hole transport layer (HTL) at maximum power conditions. Defects in the perovskite layer at this junction can significantly limit the performance. Accordingly, abrupt step-edges are thought to be detrimental for ABC devices, as they could lead to defects in the perovskite layer during film formation. For instance, roughness of the substrate is known to potentially modify the formation energy of defects. A unique feature resulting from the use of CFL and deposition by evaporation is that it produces electrodes whose thickness is gradually tapered, or ramping transition with an acute angle as opposed to a right-angle step-edge, at the ETL/HTL junction, facilitating smooth and conformal perovskite film morphology with no observable gaps in the interfaces (see FIG. 3B and FIG. 4).

The CFL process forms a dispersed network of thin cracks with an undercut profile, where the edges curl upward from the substrate (see Panels a-c FIG. 5A and Panel c of FIG. 5B). Drying-induced cracking of colloidal films occurs due to solvent evaporation contracting the film volume, leading to stress that is relieved through crack formation. The crack template thickness controls the crack width and crack spacing. The thinner the layer, the closer packed or the finer the crack network formed. The spin speed was varied during crack template formation (where "crack template formation" refers to both the depositing of the liquid layer and its drying to form cracks) (see FIG. 6) and a speed of 8000 rpm was chosen for the experiments described herein, as it led to the finest dimensions, e.g., crack widths, lengths, and/or spacing, without any delamination of the PMMA template from the underlying FTO layer (see Panels a and b of FIG. 5A). Additional reductions in crack spacing could be achieved through optimization of the PMMA layer thickness, although there is a minimum critical film thickness limit around 700 nm. The crack template edges may curl up at the PMMA solid layer/FTO interface, forming an undercut profile due to poor template adhesion (see Panel c of FIG. 5A). The undercut profile is ideal for preventing deleterious sidewall connections between the HTL (e.g., $Ni/NiO_x$) and the underlying ETL (e.g., $SnO_2$) during subsequent insulating layer deposition and metal evaporation steps.

To independently control crack width and crack spacing, oxygen plasma treating of the solid template was introduced as a method to widen the PMMA nanoparticle crack network and increase the undercut profile for subsequent evaporation and liftoff (see Panels a-c of FIG. 5B).

Oxygen plasma widens the cracks possibly through a combination of etching and oxidizing the exposed surface of the PMMA network. Oxidizing the exposed surfaces may contract the volume of a thin top layer inducing tensile stress in the film and causing the edges to further curl upward (see Panels b and c of FIG. 5B). UV-ozone was also demonstrated as a successful alternative widening process if a non-vacuum patterning technique is desired (see FIG. 7). Crack widening controls the resulting transmittance, crack width and spacing, relative transport layer areas, and sheet resistance of the resulting ABC electrodes (see FIGS. 5C-E).

The CFL ABC electrode network demonstrates a relatively flat transmission spectra across the visible spectrum maintained as a function of various oxygen plasma treating times (see FIG. 5C). Longer oxygen plasma treatment times lowered the overall transmittance (see FIG. 5C) due to a greater relative area of the opaque Ni/NiO$_x$ crack network (see FIG. 5D). The area of the Ni/NiO$_x$ network is inversely proportional to the sheet resistance (see FIG. 5D). The low sheet resistance achieved, <20Ω/□ (see FIG. 5D), is comparable to traditional ITO electrodes and ensures negligible solar cell series resistance from the hole collecting Ni/NiO$_x$ network. To better understand the areal and geometric changes, the mean crack width and crack spacing as a function of widening time was determined (see FIG. 5E). The mean crack width increased (range between 0.68±0.48 µm and 2.4±2.0 µm) whereas the mean crack spacing decreased (range between 7.1±5.2 µm and 4.4±3.3 µm) after about two hours of O$_2$ plasma (see FIG. 5E). These relationships and the controllable transparency can be utilized to, among other things, design semi-transparent solar cells for building-integrated applications.

Wider crack widths (2.4±2.0 µm as opposed to the unwidened 0.68±0.48 sm) and increased Ni/NiO$_x$ area (in the xy-plane; see FIG. 1) led to improved ABC PSC performance (see FIG. 8A). The photovoltaic performance of the ABC PSCs was evaluated using current-density voltage scans. Boxplots display the statistical variation of several devices as a function of O$_2$ plasma exposure time or area fraction of NiO$_x$ (see FIG. 8A). V$_{oc}$ remained largely unchanged (see Panel a of FIG. 8A) compared to a significant boost in short-circuit current density (J$_{sc}$) (see Panel b of FIG. 8A) and fill factor (FF) (see Panel c of FIG. 8A). The boost in J$_{sc}$ and FF resulted in increased power-conversion efficiency (PCE) for both forward and reverse scans (see Panel d of FIG. 8A).

Increased J$_{sc}$ and FF may be due to greater light absorption from increased reflective metallic Ni area and more balanced charge transport. Longer O$_2$ plasma exposure times increased light absorption due to increased Ni area allowing photons not absorbed during the initial pass through the device to be reflected by the metallic Ni contact back into the perovskite layer. These reflected photons could then be absorbed by the perovskite layer and contribute to photocurrent, consistent with the increased J$_{sc}$ (see Panel b of FIG. 8A).

The fabricated ABC devices also exhibited bifacial performance since ABC substrates are semitransparent. Current-voltage scans were measured for each set of devices by illuminating through the glass-ITO substrate, i.e., illuminated from the bottom (see FIG. 9). Each performance metric followed the same trends as illuminated from the top of the perovskite, with roughly half of the PCE as obtained when illuminating from the top (see FIG. 9). Increased J$_{sc}$ cannot be purely attributed to increased light absorption because back-illumination still shows an increase in J$_{sc}$ with longer O$_2$ plasma times where more metallic Ni area leads to less light absorption in the perovskite (see FIG. 9).

The observed J$_{sc}$ increase may be due to more balanced charge transport and/or extraction of photogenerated carriers. Devices based on wider crack widths reduce the long distances holes must travel laterally through the perovskite over the larger SnO$_2$ domains. Shorter distances lower the probability of recombination. Specifically, between 0 hour and 1 hour of O$_2$ plasma treating widening time increased the mean NiO$_x$ crack width from 0.7 µm to 2.4 µm while decreasing the mean SnO$_x$ area crack spacing from 7.1 µm to 4.4 µm. In other words, the mean distance electrons travel laterally over NiO$_x$ increased from 0.35 µm to 1.2 µm, whereas the mean distance holes travel laterally over SnO$_x$ decreased from 3.6 µm to 2.2 µm. As both the electron and hole diffusion lengths are around 1 µm, the limiting transport distance seems to be over SnO$_2$, consistent with the observed increase in J$_{sc}$ with longer O$_2$ widening times and decreased SnO$_2$ domain size. Alternatively, increased interfacial contact area of the NiO$_x$ could balance charge extraction. In addition to increased J$_{sc}$, increased FF with longer O$_2$ plasma times is likely due to reduced sheet resistance in the wider crack widths, <20Ω/□ as opposed to >200Ω/□. Lower FF in thinner crack networks is likely due to increased series resistance in the nickel network and potentially the perovskite layer.

Significant hysteresis was apparent for each condition (see FIG. 8B). Stabilized power output (SPO) for each device stabilized near the forward-scan-derived PCE for each device and showed a similar trend of increasing SPO with widening time (see FIG. 8C). The best SPO, 2.94% at V=400 mV (see FIG. 10), is the highest reported to date for back-contact or ABC PSCs fabricated with a scalable solution processed patterning technique.

In summary, CFL was successfully utilized to replace photolithography to form defect-tolerant back-contact electrodes and ABC PSCs. Smooth perovskite film morphology across the patterned substrate was achieved by tapered transitions between the ETL and HTL layers of the CFL back-contact electrodes (i.e., charge selective contacts). The tapered transitions are formed through a curling effect and undercut profile of the PMMA crack network, which is ideal for the subsequent film depositions and liftoff. A method for widening the crack network was developed to modulate the transparency, sheet resistance, and independently control the relative areas of the ETL and HTL in contact with the perovskite while maintaining the optimum undercut profile. Increasing the Ni/NiO$_x$ HTL area increased J$_{sc}$, FF, and PCE in ABC PSCs, indicating more balanced charge transport. A relatively high stabilized power output was achieved with this process. Overall, CFL offers three main advantages for patterning back-contact electrodes: (1) scalable solution processibility, (2) ideal liftoff profiles, and (3) defect tolerant and tunable electrode design. This work provides a route toward scalable fabrication and opens the door to facilities without photolithography capabilities to fabricate and study the promising back-contact architecture for PSCs.

An outstanding feature of cracked film lithography is that it produces electrodes with thickness that gradually tapers at the electron transport layer (ETL) and hole transport layer (HTL) junction, facilitating smooth and conformal perovskite film morphology. This is important because photogenerated electron and hole densities are greatest at this junction at maximum power conditions. Thus, it is desirable to have minimal processing defects at this junction. Tapered edges of the electrodes are formed through a combination of an undercut profile in the cracked network and a slight angle during the directional electron-beam (e-beam) evaporations (see FIG. 11). The e-beam was offset to the center of the substrate stage by 17° (see Panel a of FIG. 11). This allows the vapor to be deposited underneath the undercut profile of the cracked-film network, as seen in the cross-section scanning electron microscopy image (see Panel b of FIG. 11).

In addition to the angle during evaporation, substrate stage rotation can be controlled (see Panel a of FIG. 11). For the insulating layer, the stage was spun during evaporation to form a larger insulating footprint. For the Ni layer, we compared spun and non-spun Ni (see FIGS. 12A and 12B). Both spun and non-spun Ni allow formation of the back-contact electrodes (see FIG. 12A). However, the spun Ni layer led to small resistance between the Ni and ITO electrodes (see FIG. 12A), whereas the non-spun Ni had greater resistance (kΩ-MΩ) (see FIG. 12A). The greater resistance between the electrodes enables higher photovoltaic performance (see FIG. 12B).

Experimental Methods

Perovskite Materials: Methylammonium bromide (Great-Cell Solar Materials), formamidinium iodide (GreatCell Solar Materials), cesium iodide (Sigma Aldrich), lead (II) bromide (TCI America), and lead (II) iodide (TCI America) powders were used to make perovskite precursors. All other chemicals were purchased from Sigma Aldrich and used as-received.

Substrate preparation: 25×25×1.1 mm patterned 20Ω/□ indium-doped tin oxide (ITO) coated glass was purchased from Colorado Concept Coatings LLC. The substrates were first scrubbed with Liquinox-DI water solution using an electric toothbrush. They were then submerged and sonicated in DI water, acetone, and isopropyl alcohol for 10 min each, followed by UV-ozone for 15 minutes immediately before $SnO_2$ deposition.

Spin-coated $SnO_2$ layer: 2.67 wt % aqueous $SnO_2$ nanoparticle solution was prepared by diluting a commercially available solution 1:4 with DI water (Alfa-Aesar tin(IV) oxide, 15% in $H_2O$ colloidal dispersion). 180 uL of nanoparticle solution was dispensed onto the clean ITO substrates before spinning at 3000 rpm for 30 s. Edges were wiped clean with a DI-water-soaked cleanroom swab for electrical probing. Finally, films were annealed at 150° C. on a hotplate in ambient air for 30 min.

CFL and widening process: Poly(methyl methacrylate) (PMMA) nanoparticle (40-80 diameter) suspensions were purchased from Jinhua Mengni Cosmetics Co., Ltd. (Zhejiang, China). The solutions were diluted to 30% wt/vol by adding an 85% vol/vol mixture of isopropyl alcohol (IPA) in de-ionized (DI) water. The solution was spun at 8000 rpm for devices and left to air dry for a few seconds to form the crack network. Oxygen plasma crack widening was performed in a Technics West Inc. Model 500-II oxygen plasma system at 120-140 W and 0.6-0.7 Torr pressure. The alternative UV-ozone widening method was performed in a Jetlight Company, Inc. Model 30 UV-ozone cleaner operated in dry air.

$SiO_2$, $Al_2O_3$, Ni electron-beam and $NiO_x$ magnetron sputter evaporation: Electron-beam evaporation was performed in an Angstrom Engineering EvoVac system with pressures ranging from (4-7)e-7 Torr. $SiO_2$ was initially evaporated at a rate of 0.3 A/s for 5 nm, followed 0.5 A/s for 10 nm, and 2.0 A/s to reach a final thickness of 100 nm. $Al_2O_3$ and Ni were evaporated at rates of 0.5 A/s for 10 nm, then 2.0 A/s to reach 100 nm. $NiO_x$ was rf sputtered in a Denton Vacuum Explorer 14 magnetron sputter system from a 2 inch stoichiometric NiO target at 60 W, 1:1 ratio of Ar:(Ar:$O_2$ 1%) at 25 mTorr for 400 s. The target was conditioned for 10 minutes at the same sputter conditions described above prior to opening the target shutter.

Liftoff: Substrates were submerged in Remover PG, product number G050200, and elevated to 70° C. for 10 min. Remover-PG is a solution based on n-methylpyrrolidone designed for clean liftoff of photoresist. They were then transferred to a fresh Remover-PG solution and sonicated for 1 min. Finally, they were rinsed again in a fresh Remover-PG solution and finished by rinsing with IPA and drying with nitrogen.

Interface processing: Back-contact substrates were cleaned by UV-ozone treatment by placing samples in a Jetlight Company, Inc. Model 30 UV-ozone cleaner operated in dry air. Then, samples were annealed in air at 300° C. for 45 min using a Fisher Scientific Isotemp Muffle Furnace.

Perovskite deposition: Triple-cation double-halide perovskite films of the form $FA_xMA_yCs_{1-x-y}Pb(I_zBr_{1-z})_3$ were deposited following a reported method. The perovskite precursor solution contained 22.4 mg MABr, 73.4 mg $PbBr_2$, 172 mg FAI, 507 mg $PbI_2$, and 15.6 mg CsI dissolved in 1 mL of 4:1 DMF:DMSO. Substrates were transferred to a nitrogen glovebox for deposition. Prior to deposition, a 50 mg/ml polystyrene solution in chlorobenzene was brushed onto the edges of the substrate to protect the contact points from perovskite deposition. Then, 70 μL of perovskite precursor solution was statically dispensed on the back-contact electrode substrates and spun at 1000 rpm for 10 s then 6000 rpm for 20 s. During the spin process, 120 μL of chlorobenzene was dispensed on to the spinning substrate with 5-6 s remaining. The simple polystyrene sacrificial mask is removed during the perovskite antisolvent process, leaving behind clear electrodes for measurements. Samples were annealed at 100° C. for 1 hr.

Device testing: Current-density-voltage (JV) measurements were performed in a nitrogen glovebox at room temperature using a Newport Oriel 94043A Sol3A Class AAA solar simulator that was calibrated with a silicon photodiode with a KG2 filter to 1-sun intensity. Scan speeds estimated at 0.48 V/s with a dwell time of 0.03 s and Number of Power Line Cycles (NPLC) of 1. All devices were masked using a 0.06 $cm^2$ area.

Optical micrograph quantification: Optical micrographs were first binarized to separate cracks from crack spacing. The ratio of black and white pixels was then used to calculate fractional crack footprint. Next, a Euclidean distance transform was used to map a given intra-crack pixel's maximum distance from that crack's edge. The mean and standard deviation of these distances were used to quantify crack width. This routine was then repeated for crack spacing areas.

EXAMPLES

Example 1. A device comprising: an irregular network of interconnected ridges in physical contact with a planar substrate; and a perovskite layer, wherein: the planar substrate comprises a support layer and a first charge selective contact layer, the first charge selective contact layer is positioned between the support layer and the interconnected ridges, each ridge comprises a second charge selective contact layer and an insulating layer, the insulating layer is positioned between the first charge selective contact layer and the second charge selective contact layer, and the perovskite layer substantially covers the plurality of interconnected ridges and the underlying planar substrate.

Example 2. The device of Example 1, wherein the network is characterized by the ridges having an average width, W, between 0.05 μm and 500 μm.

Example 3. The device of either Example 1 or Example 2, wherein W is between 0.1 μm and 100 μm.

Example 4. The device of any one of Examples 1-3, wherein the network is characterized by the ridges having an average height, H, between 0.01 μm and 10 μm.

Example 5. The device of any one of Examples 1-4, wherein H is between 0.05 μm and 1 μm.

Example 6. The device of any one of Examples 1-5, wherein the network is characterized by the ridges having an average spacing, S, between 0.1 μm and 1,000 μm.

Example 7. The device of any one of Examples 1-6, wherein S is between 0.1 μm and 1000 μm.

Example 8. The device of any one of Examples 1-7, wherein the network is characterized by the ridges having a length, L, between 1 μm and 500 μm.

Example 9. The device of any one of Examples 1-8 wherein L is between 1 μm and 100 μm.

Example 10. The device of any one of Examples 1-9, wherein the substrate is substantially transparent.

Example 11. The device of any one of Examples 1-10, wherein the first charge selective contact layer is electron selective.

Example 12. The device of any one of Examples 1-11, wherein the first charge selective contact layer comprises a transparent conductive oxide.

Example 13. The device of any one of Examples 1-12, wherein the second charge selective contact layer is hole selective.

Example 14. The device of any one of Examples 1-13, wherein: the second charge selective contact layer comprises a metal layer and a metal oxide layer, and the metal oxide layer is positioned between the metal layer and the insulating layer.

Example 15. The device of any one of Examples 1-14, wherein the metal oxide layer comprises nickel oxide.

Example 16. The device of any one of Examples 1-15, wherein the metal layer comprises nickel.

Example 17. The device of any one of Examples 1-16, wherein the perovskite comprises at least one of a three-dimensional (3D) structure, a two-dimensional (2D) structure, a one-dimensional (1D) structure, or a zero-dimensional (0D) structure.

Example 18. The device of any one of Examples 1-17, wherein: the perovskite has a structure according to $ABX_3$, A comprises a first cation, B comprises a second cation, and X comprises an anion.

Example 19. The device of any one of Examples 1-18, wherein A comprises at least one of cesium, methylammonium (MA), or formamidinium (FA).

Example 20. The device of any one of Examples 1-19, wherein B comprises at least one lead or tin.

Example 21. The device of any one of Examples 1-20, wherein X comprises a halide.

Example 22. The device of any one of Examples 1-21, wherein the perovskite comprises $Cs_{1-z}(MA_{1-x}FA_x)_zPb(I_{1-a}Br_a)_3$.

Example 23. The device of any one of Examples 1-22, wherein $0.85 \leq z \leq 0.99$, $0.05 \leq x \leq 0.25$, and $0.05 \leq z \leq 0.25$.

Example 24. The device of any one of Examples 1-23, wherein the perovskite layer has a thickness between 500 nm and 1000 nm.

Example 25. The device of any one of Examples 1-24, wherein the thickness is between 400 nm and 800 nm.

Example 26. The device of any one of Examples 1-25, wherein the insulating layer comprises a metal oxide.

Example 27. The device of any one of Examples 1-26, wherein the metal oxide comprises at least one of silica or alumina.

Example 28. The device of any one of Examples 1-27, wherein the device is a solar cell or light-emitting diode.

Example 29. A method comprising: a first depositing of a liquid layer onto a first selective contact layer; a first treating of the liquid layer thereby transforming the liquid layer into a solid layer; a second depositing of an insulating material onto the solid layer, a third depositing of a second selective contact material onto the insulating material; and removing the solid layer, wherein: the solid layer comprises a network of cracks having an average depth between 0.01 μm and 10 μm, the second depositing results in at least a first portion of the depth being filled with the insulating material, the third depositing results in at least a second portion of the depth being filled with the second selective contact material, the removing results in the removal of substantially all of the insulating material and substantially all of the second selective contact material except for the insulating material and second selective contact material positioned in the depth of the cracks, the removing results in the forming of a network of ridges positioned on the first selective contact layer, the ridges each comprise a layer of the insulating material and a layer of the second selective contact material, the layer of the insulating material is positioned between the first selective contact layer and the layer of the second selective contact material, and each ridge has a height, H, between 0.01 μm and 10 μm.

Example 30. The method of Example 29, wherein the first treating comprises at least one of heating the liquid layer or exposing the liquid layer to a gas.

Example 31. The method of either Example 29 or 30, further comprising: after the first treating, a second treating, wherein: before the second treating the cracks have a first average width, and after the second treating the cracks have a second average width that is greater than the first average width.

Example 32. The method of any one of Examples 29-31, wherein the second treating comprises exposing the solid layer to at least one of a plasma, ozone, or ultraviolet (UV) light.

Example 33. The method of any one of Examples 29-32, wherein the plasma is an oxygen plasma.

Example 34. The method of any one of Examples 29-33, wherein the second average width is between 0.2 μm and 5 μm larger than the first average width.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein.

Thus, the following claims are hereby incorporated into this Detailed Description, with each claim standing on its own as a separate aspect, embodiment, or configuration.

What is claimed is:

1. A device comprising:
   an irregular network of interconnected ridges in physical contact with a planar substrate; and
   a perovskite layer, wherein:
   the planar substrate comprises a support layer and a first charge selective contact layer,
   the first charge selective contact layer is positioned between the support layer and the interconnected ridges,
   each of the interconnected ridges comprises a second charge selective contact layer and an insulating layer,
   the insulating layer is positioned between the first charge selective contact layer and the second charge selective contact layer, and
   the perovskite layer substantially covers the interconnected ridges and the underlying planar substrate laid under the perovskite layer.

2. The device of claim 1, wherein the network is characterized by the ridges having an average width, W, between 0.05 μm and 500 μm.

3. The device of claim 1, wherein the network is characterized by the ridges having an average height, H, between 0.01 μm and 10 μm.

4. The device of claim 1, wherein the network is characterized by the ridges having an average spacing, S, between 0.1 μm and 1,000 μm.

5. The device of claim 1, wherein the network is characterized by the ridges having a length, L, between 1 μm and 500 μm.

6. The device of claim 1, wherein the first charge selective contact layer is electron selective.

7. The device of claim 6, wherein the first charge selective contact layer comprises a transparent conductive oxide.

8. The device of claim 1, wherein the second charge selective contact layer is hole selective.

9. The device of claim 8, wherein:
   the second charge selective contact layer comprises a metal layer and a metal oxide layer, and
   the metal oxide layer is positioned between the metal layer and the insulating layer.

10. The device of claim 1, wherein the perovskite comprises at least one of a three-dimensional (3D) structure, a two-dimensional (2D) structure, a one-dimensional (1D) structure, or a zero-dimensional (0D) structure.

11. The device of claim 10, wherein:
    the perovskite has a structure according to $ABX_3$,
    A comprises a first cation,
    B comprises a second cation, and
    X comprises an anion.

12. The device of claim 11, wherein A comprises at least one of cesium, methylammonium (MA), or formamidinium (FA).

13. The device of claim 11, wherein B comprises at least one lead or tin.

14. The device of claim 11, wherein X comprises a halide.

15. The device of claim 11, wherein the perovskite comprises $Cs_{1-z}(MA_{1-x}FA_x)_zPb(I_{1-a}Br_a)_3$.

16. The device of claim 15, wherein $0.85 \leq z \leq 0.99$, $0.05 \leq x \leq 0.25$, and $0.05 \leq z \leq 0.25$.

17. The device of claim 1, wherein the perovskite layer has a thickness between 500 nm and 1000 nm.

18. The device of claim 1, wherein the insulating layer comprises a metal oxide.

* * * * *